US012682961B2

(12) United States Patent
Chen et al.

(10) Patent No.: US 12,682,961 B2
(45) Date of Patent: Jul. 14, 2026

(54) CROSS TEMPERATURE NAND READ ADJUSTMENT

(71) Applicant: Sandisk Technologies, Inc., Milpitas, CA (US)

(72) Inventors: Albert Bor Kai Chen, Milpitas, CA (US); Sujjatul Islam, San Jose, CA (US); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 127 days.

(21) Appl. No.: 18/791,689

(22) Filed: Aug. 1, 2024

(65) Prior Publication Data

US 2026/0038601 A1 Feb. 5, 2026

(51) Int. Cl.

| | |
|---|---|
| *G11C 16/26* | (2006.01) |
| *G11C 11/56* | (2006.01) |
| *G11C 16/04* | (2006.01) |
| *G11C 16/08* | (2006.01) |
| *G11C 16/10* | (2006.01) |
| *G11C 16/24* | (2006.01) |
| *G11C 16/34* | (2006.01) |

(52) U.S. Cl.
CPC .......... *G11C 16/26* (2013.01); *G11C 16/0483* (2013.01); *G11C 16/08* (2013.01); *G11C 16/10* (2013.01); *G11C 16/24* (2013.01)

(58) Field of Classification Search
CPC ..... G11C 16/26; G11C 16/0483; G11C 16/08; G11C 16/10; G11C 16/24
See application file for complete search history.

(56) References Cited

U.S. PATENT DOCUMENTS

| | | | |
|---|---|---|---|
| 8,509,000 | B2 | 8/2013 | Sharon et al. |
| 8,576,624 | B2 | 11/2013 | Dutta et al. |
| 9,202,579 | B2 | 12/2015 | Hsiung et al. |
| 9,472,298 | B1 | 10/2016 | Louie et al. |
| 9,710,325 | B2 | 7/2017 | Chen et al. |
| 10,475,523 | B2 | 11/2019 | Sharon et al. |
| 11,194,523 | B2 | 12/2021 | Achtenberg et al. |
| 2013/0163342 | A1* | 6/2013 | Dutta ................. G11C 11/5628 |
| | | | 365/185.21 |

(Continued)

OTHER PUBLICATIONS

International Search Report & The Written Opinion of the International Searching Authority dated Aug. 6, 2025, International Application No. PCT/US2025/026012.

*Primary Examiner* — Han Yang
*Assistant Examiner* — Elizabeth Rose Agger
(74) *Attorney, Agent, or Firm* — Pearl Cohen Zedek Latzer Baratz LLP

(57) ABSTRACT

Technology for re-calibrating a temperature coefficient (Tco) for reading NAND memory cells. The Tco may be re-calibrated based on an amount of data retention impact to NAND memory cells since the NAND memory cells were programmed. The data retention impact may be measured by determining a shift to a candidate Vt distribution. The candidate Vt distribution may be selected as one that exhibits a significant data retention impact. The Tco may include, but is not limited to a bit line voltage Tco or a Vread Tco. The bit line voltage Tco may be used to establish the bit line voltage during read. The Vread Tco may be used to establish a voltage to unselected word lines during read.

14 Claims, 24 Drawing Sheets

1500

(56)  References Cited

U.S. PATENT DOCUMENTS

| | | | |
|---|---|---|---|
| 2015/0310938 A1 | 10/2015 | Kim et al. | |
| 2015/0357043 A1* | 12/2015 | Im | G11C 16/32 |
| | | | 365/185.11 |
| 2016/0179407 A1* | 6/2016 | Gorobets | G06F 3/0653 |
| | | | 711/103 |
| 2017/0255403 A1* | 9/2017 | Sharon | G06F 3/064 |
| 2020/0005878 A1* | 1/2020 | Lu | G11C 11/5642 |
| 2020/0118620 A1 | 4/2020 | Bazarsky et al. | |
| 2020/0159465 A1* | 5/2020 | Achtenberg | G11C 7/04 |
| 2020/0321061 A1 | 10/2020 | Kang et al. | |
| 2020/0363969 A1 | 11/2020 | Shen et al. | |
| 2021/0350869 A1* | 11/2021 | Parthasarathy | G11C 29/028 |
| 2023/0393936 A1 | 12/2023 | Xotta et al. | |
| 2024/0096408 A1* | 3/2024 | Lu | G11C 11/4085 |
| 2024/0249782 A1* | 7/2024 | Choi | G11C 16/26 |

* cited by examiner

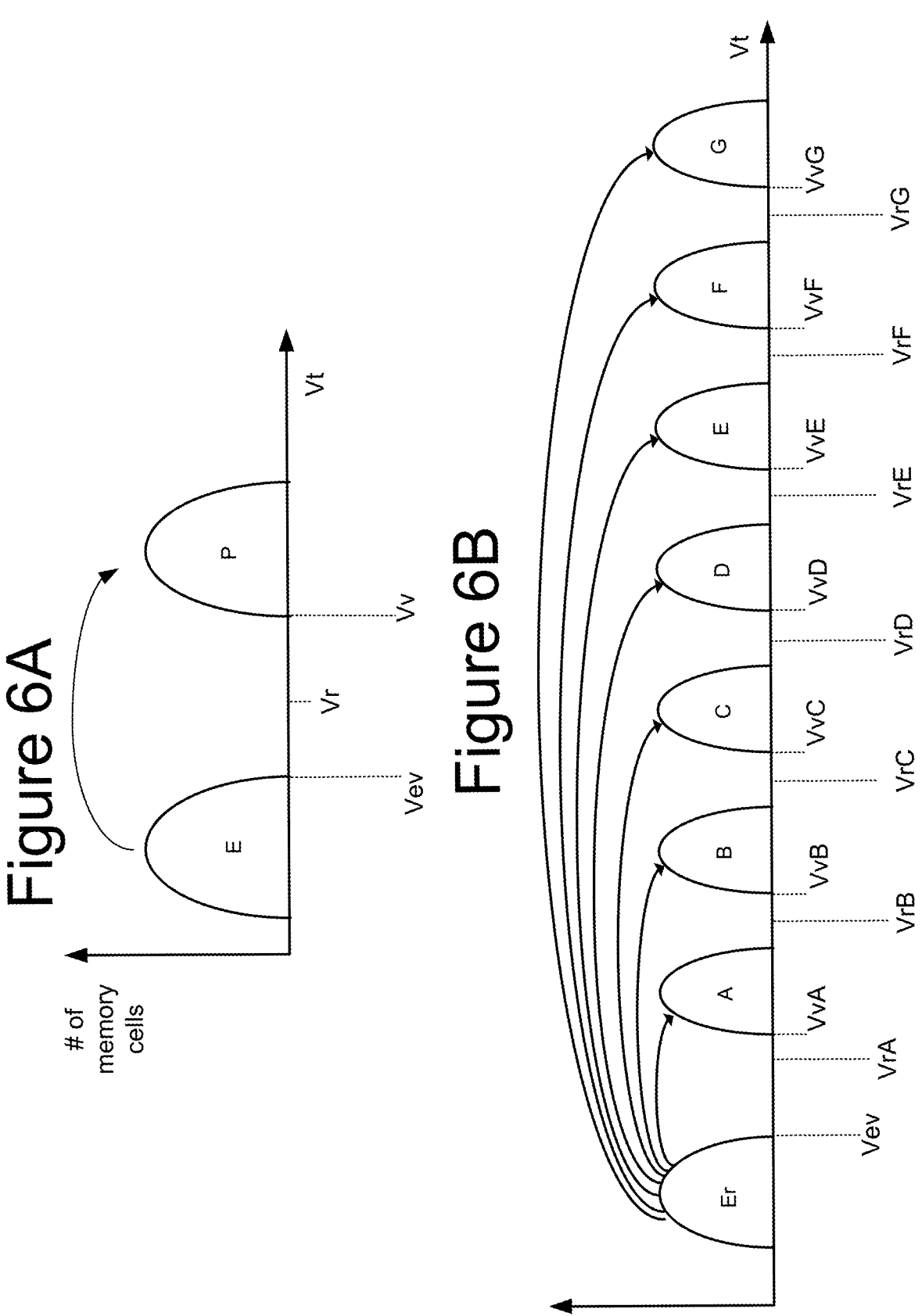

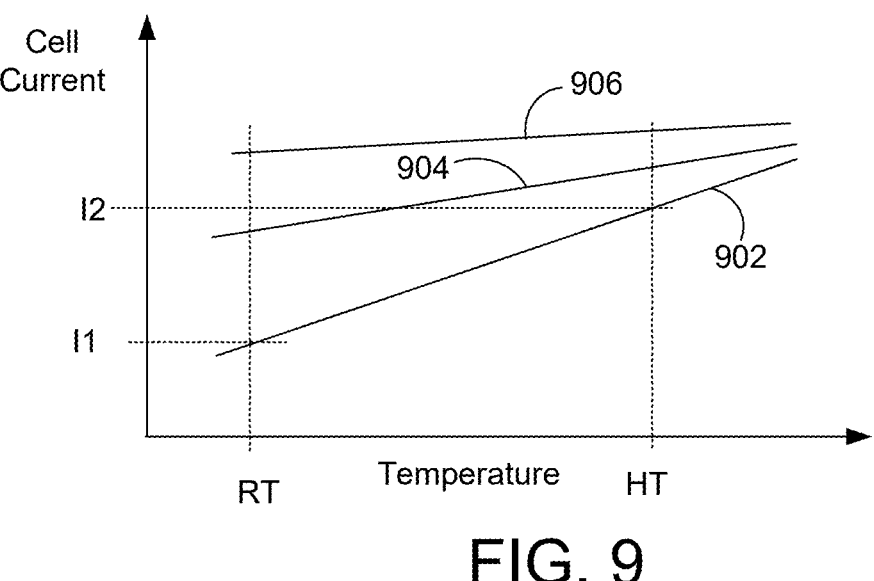
FIG. 9
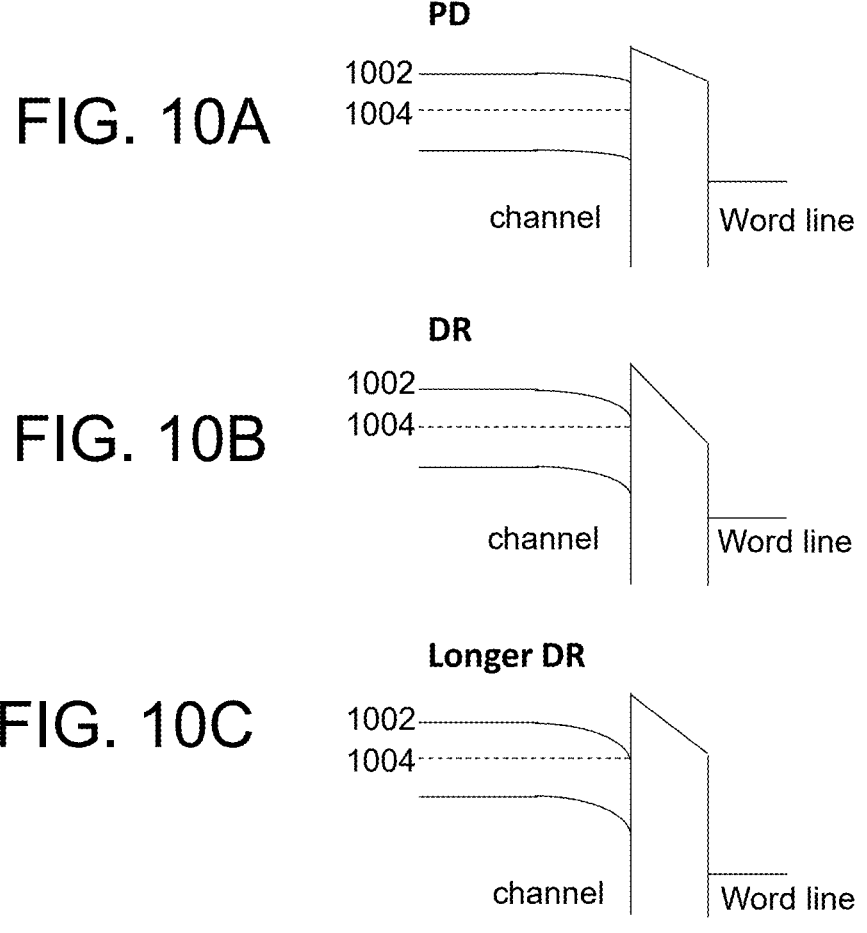
FIG. 10A
FIG. 10B
FIG. 10C

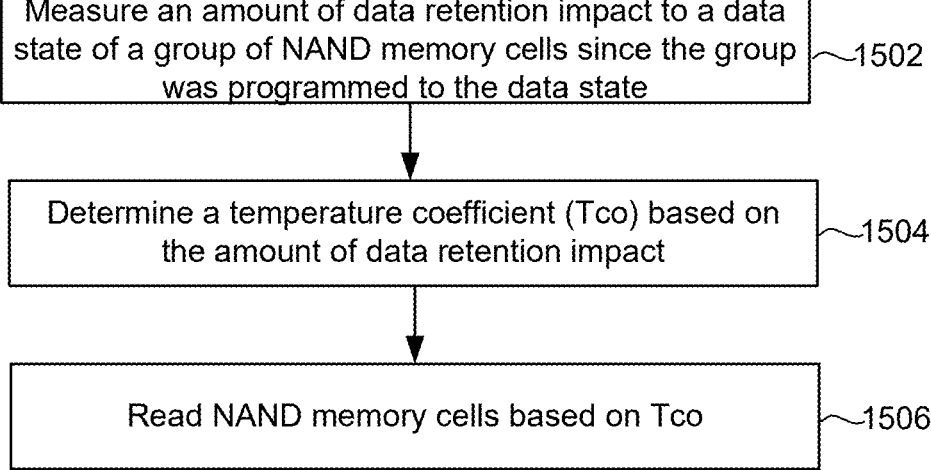

Measure an amount of data retention impact to a data state of a group of NAND memory cells since the group was programmed to the data state   ~1502

Determine a temperature coefficient (Tco) based on the amount of data retention impact   ~1504

Read NAND memory cells based on Tco   ~1506

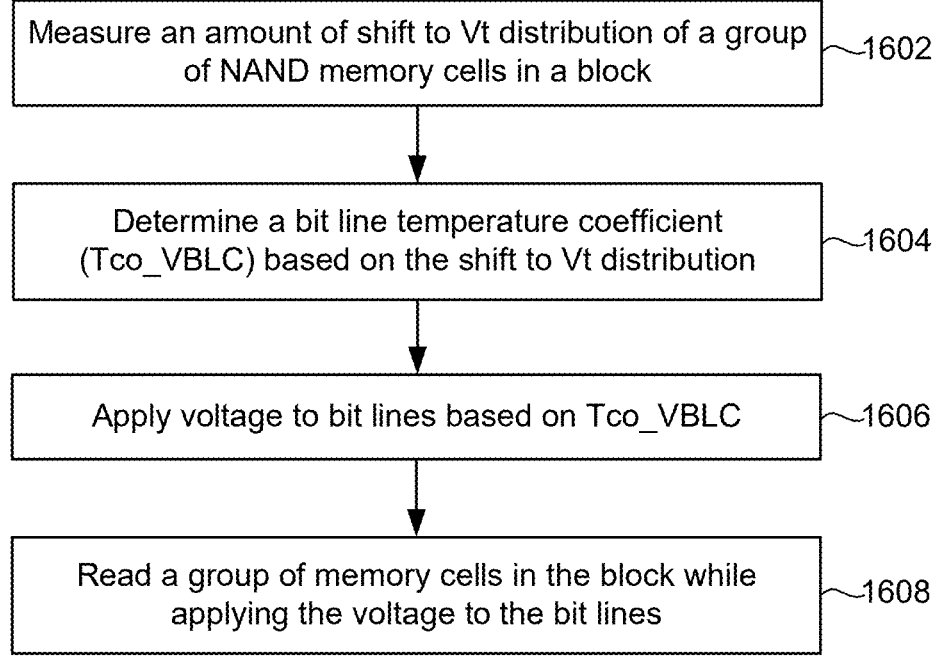

Measure an amount of shift to Vt distribution of a group of NAND memory cells in a block   ~1602

Determine a bit line temperature coefficient (Tco_VBLC) based on the shift to Vt distribution   ~1604

Apply voltage to bit lines based on Tco_VBLC   ~1606

Read a group of memory cells in the block while applying the voltage to the bit lines   ~1608

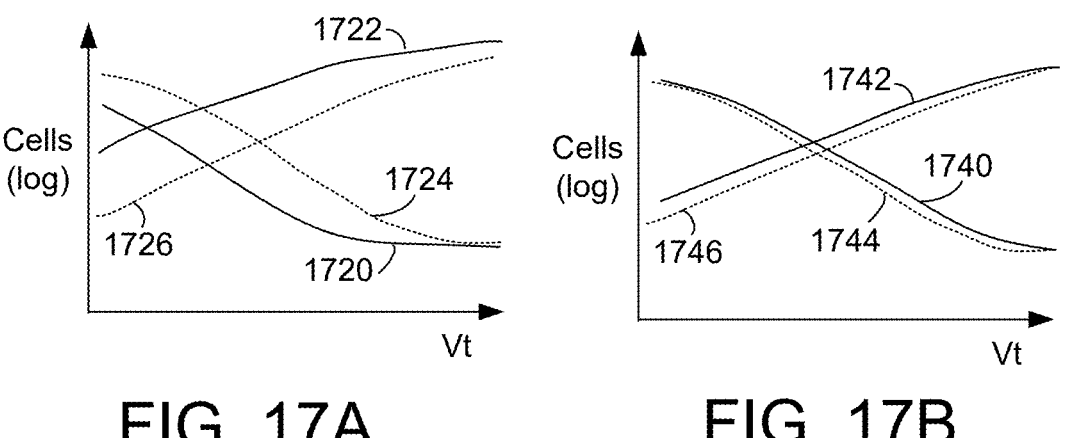
FIG. 17A        FIG. 17B
FIG. 18
1800
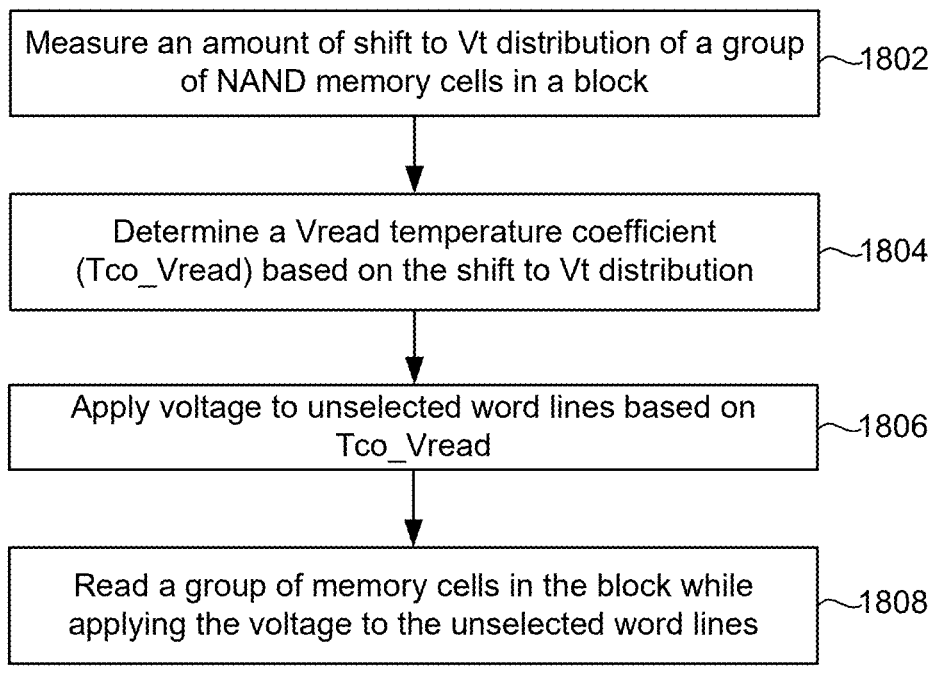

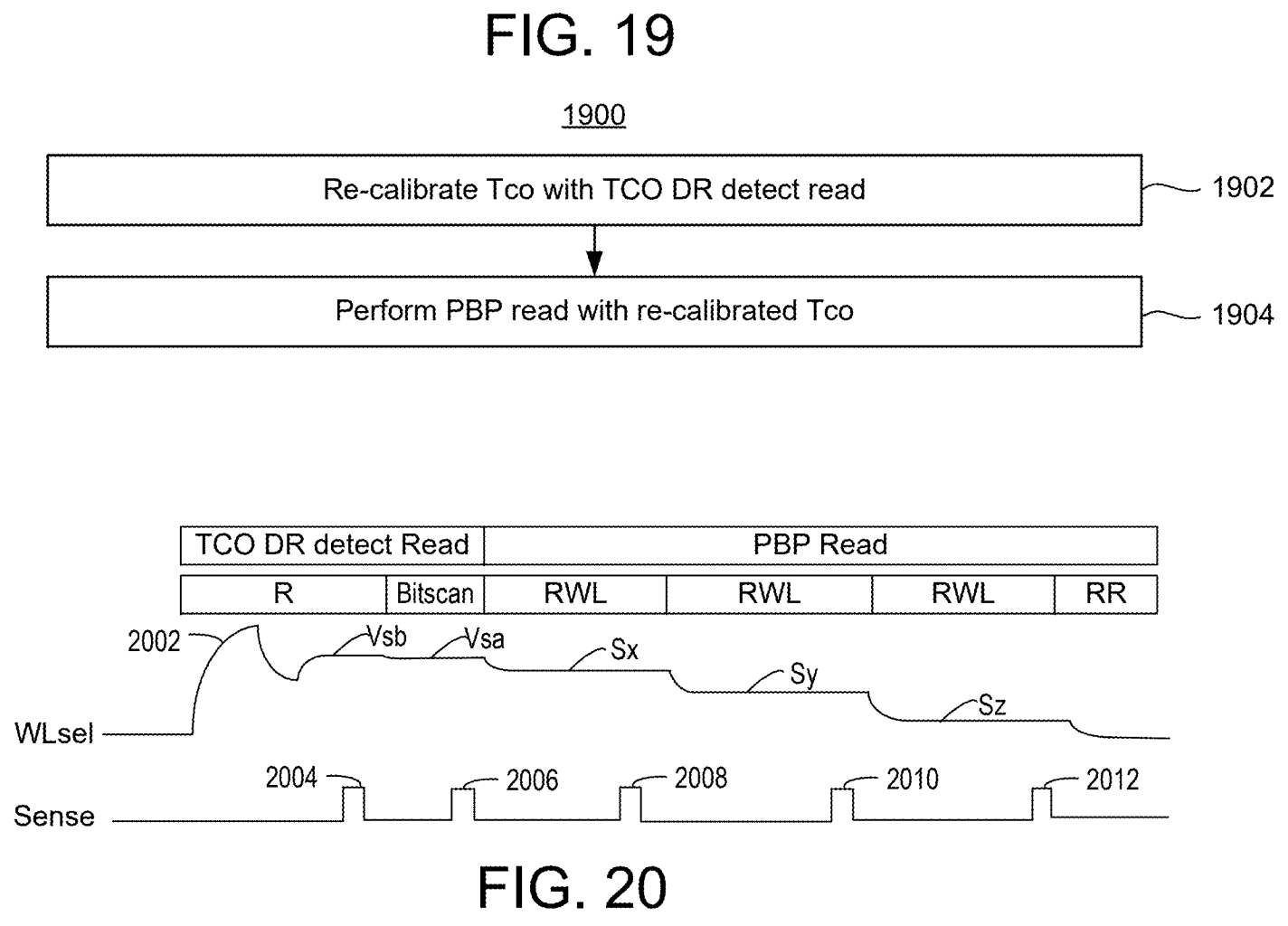

| Re-calibrate Tco with TCO DR detect read | 1902 |

↓

| Perform PBP read with re-calibrated Tco | 1904 |

FIG. 20

| TCO DR detect Read | PBP Read |
| --- | --- |

| R | Bitscan | RWL | RWL | RWL | RWL | RR |

WLsel

Sense

Vsb   Vsa   Sx   Sy   Sz 2002   2004   2006   2008   2010   2012

2100

Re-calibrate Tco with TCO DR detect read — 2102

Perform Valley Scan with re-calibrated Tco — 2104

2300

Re-calibrate Tco with TCO DR detect read — 2302

↓

Perform bitscan with re-calibrated Tco to dynamically adjust read levels — 2304

↓

Read memory cells with dynamically adjusted read levels and re-calibrated Tco — 2306

| Parameter Name | Bitscan count | TCO_VBLC |
|---|---|---|
| TCO_DR0 | N < a | Default Value |
| TCO_DR1 | a ≤ N < b | -2 DAC |
| TCO_DR2 | b ≤ N < c | -4 DAC |
| TCO_DR3 | c ≤ N | -6 DAC |

*2502* → Parameter Name  *2504* → Bitscan count  *2506* → TCO_VBLC

FIG. 25A

| Address | | | | | | | | | | Value |
|---|---|---|---|---|---|---|---|---|---|---|
| 0 | 0 | | | | | | | | | 60 |
| 0 | 1 | | | | | | | | x | 80 |
| 1 | 0 | | | | | | | | | 100 |
| 1 | 1 | | | | | | | | | 120 |

FIG. 25B

| Address | | | | | | | | Value |
|---|---|---|---|---|---|---|---|---|
| 0 | | | | | | | | -1 |
| 1 | | | | | | | x | -2 |

FIG. 25E

| Address | | | | | | | | | | Value |
|---|---|---|---|---|---|---|---|---|---|---|
| 0 | 0 | | | | | | | | | 120 |
| 0 | 1 | | | | | | | | x | 140 |
| 1 | 0 | | | | | | | | | 160 |
| 1 | 1 | | | | | | | | | 180 |

FIG. 25C

| Address | | | | | | | | Value |
|---|---|---|---|---|---|---|---|---|
| 0 | | | | | | | | -3 |
| 1 | | | | | | | x | -4 |

FIG. 25F

| Address | | | | | | | | | | Value |
|---|---|---|---|---|---|---|---|---|---|---|
| 0 | 0 | | | | | | | | | 160 |
| 0 | 1 | | | | | | | | | 180 |
| 1 | 0 | | | | | | | | x | 200 |
| 1 | 1 | | | | | | | | | 220 |

FIG. 25D

| Address | | | | | | | | Value |
|---|---|---|---|---|---|---|---|---|
| 0 | | | | | | | | -5 |
| 1 | | | | | | | x | -6 |

FIG. 25G

CROSS TEMPERATURE NAND READ ADJUSTMENT

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the physical block.

One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with layers of materials to create a vertical column of memory cells (e.g., NAND string). These layers may include one or more layers for a tunnel dielectric, a charge-trapping material, and a channel (or body).

For memory such as NAND, a large set of memory cells are erased prior to programming. After erasing, the memory cells are programmed one unit at a time. In some techniques, the memory cells are programmed one word line at a time. The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell. Each data state may be associated with a unique Vt distribution.

Once the memory cells in the memory device have been programmed, data may be read from the memory cells by sensing the programmed states of the memory cells. In one technique, the memory cells are sensed at one or more "read reference voltages." A read reference voltage is used to distinguish between two of the states. However, sensed states can sometimes vary from the written states due to one or more factors. One factor is that the memory cell current depends on the temperature. Reading memory cells at different temperature from the temperature at programming results in a cross-temperature effect. The memory system may compensate for cross-temperature effects by applying a temperature coefficient (Tco) to a read parameter.

However, challenges remain in handling cross-temperature effects when reading NAND memory cells.

BRIEF DESCRIPTION OF THE DRAWINGS

Like-numbered elements refer to common components in the different figures.

FIGS. 6A, 6B and 6C depict threshold voltage distributions.

FIG. 9 is a graph of an example of NAND memory cell current versus temperature for different data retention times.

FIGS. 10A, 10B, and 10C are band diagrams of NAND memory cells corresponding to the three data retention times in FIG. 9.

FIG. 15 is a flowchart of one embodiment of a process of reading NAND using a Tco based on an amount of data retention impact.

FIG. 16 is a flowchart of an embodiment of a process \ of reading NAND memory cells while applying a bit line voltage that is based on a Tco based on a shift to a Vt distribution.

FIGS. 17A and 17B are graphs depicting cell current versus Vt level.

FIG. 18 is a flowchart of an embodiment of a process of reading NAND memory cells while applying a Vread voltage that is based on a Tco based on a shift to a Vt distribution.

FIG. 19 is a flowchart of one embodiment of a process of reading NAND memory cells after re-calibrating a Tco based on a DR impact.

FIG. 20 shows timing of signals in an embodiment of the process of FIG. 19.

FIGS. 25A-25G depict further details of an embodiment of Tco parameters.

DETAILED DESCRIPTION

Technology is disclosed for re-calibrating a temperature coefficient (Tco) for reading NAND memory cells. In an embodiment, the Tco is re-calibrated based on an amount of data retention impact to NAND memory cells since the NAND memory cells were programmed. The data retention effect is due to a change in charge in the memory cell between programming and sensing. This change in charge results in a change in Vt of the memory cell. The data retention impact may be measured by determining a shift to a candidate Vt distribution. The candidate Vt distribution may be selected as one that exhibits a significant data retention impact. The Tco may include, but is not limited to, a bit line voltage Tco or a Vread Tco. The bit line voltage Tco may be used to establish the bit line voltage during read. The Vread Tco may be used to establish a voltage to unselected word lines during read. Recalibrating the Tco based on the data retention impact provides for a Tco that is more accurate across a wide range of data retention times, where data retention time refers to the amount of time since the memory cells were programmed.

Figure 1:
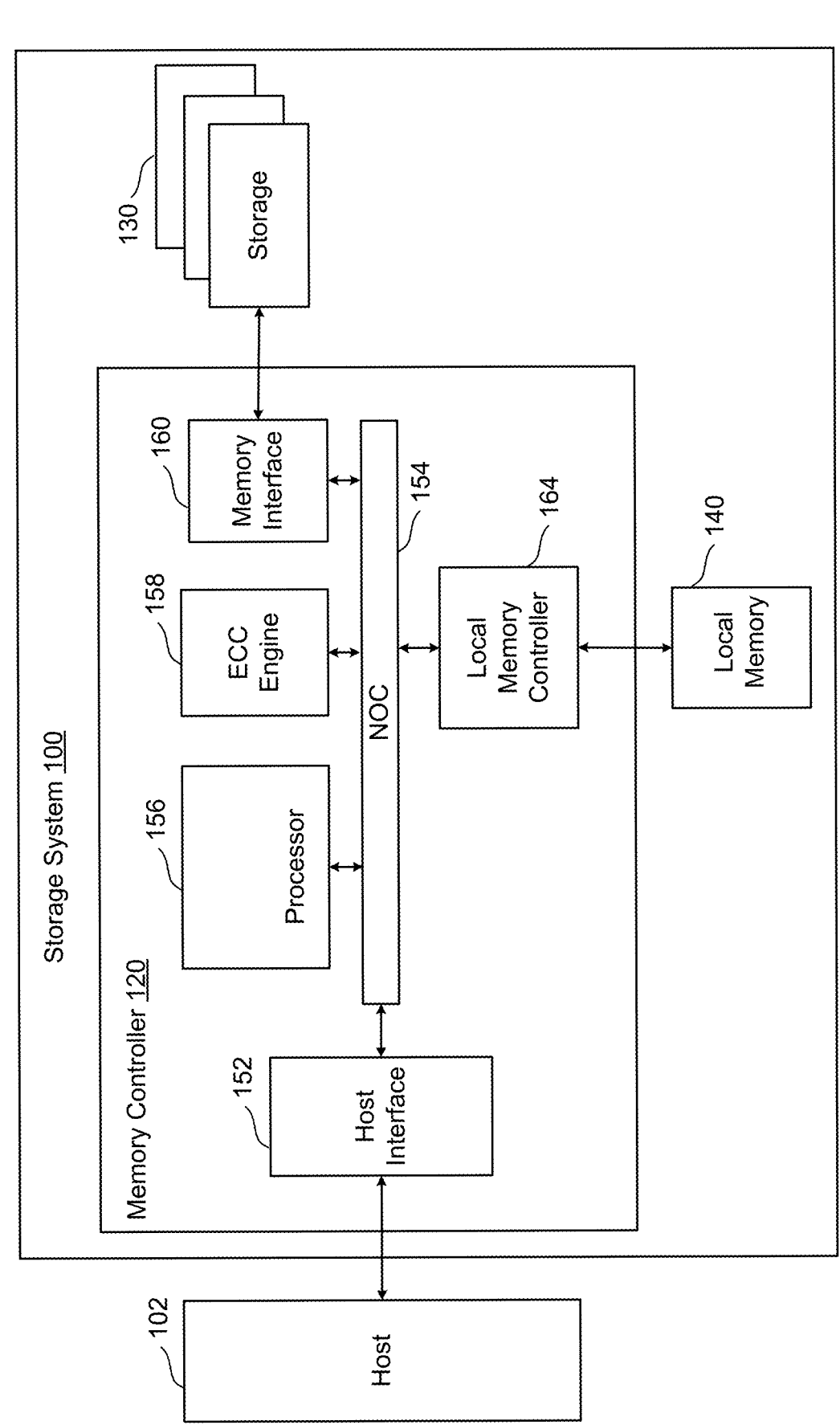
FIG. 1 is a block diagram depicting one embodiment of a memory system.

FIG. 1 is a block diagram of one embodiment of a memory system 100 that implements the technology described herein. In one embodiment, memory system 100 is a solid state drive ("SSD"). Memory system 100 can also be a memory card, USB drive or other type of memory system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC s can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations such as programming, erasing, reading, and memory management processes. In one embodiment, processor 156 is programmed by firmware. In other embodiments, processor 156 is a custom and dedicated hardware circuit without any software. Processor 156 may also implement a translation module, as a software/firmware process or as a dedicated hardware circuit. In many systems, the non-volatile memory is addressed internally to the memory system using physical addresses associated with the one or more memory die. However, the host system will use logical addresses to address the various memory locations. This enables the host to assign data to consecutive logical addresses, while the memory system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a memory system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
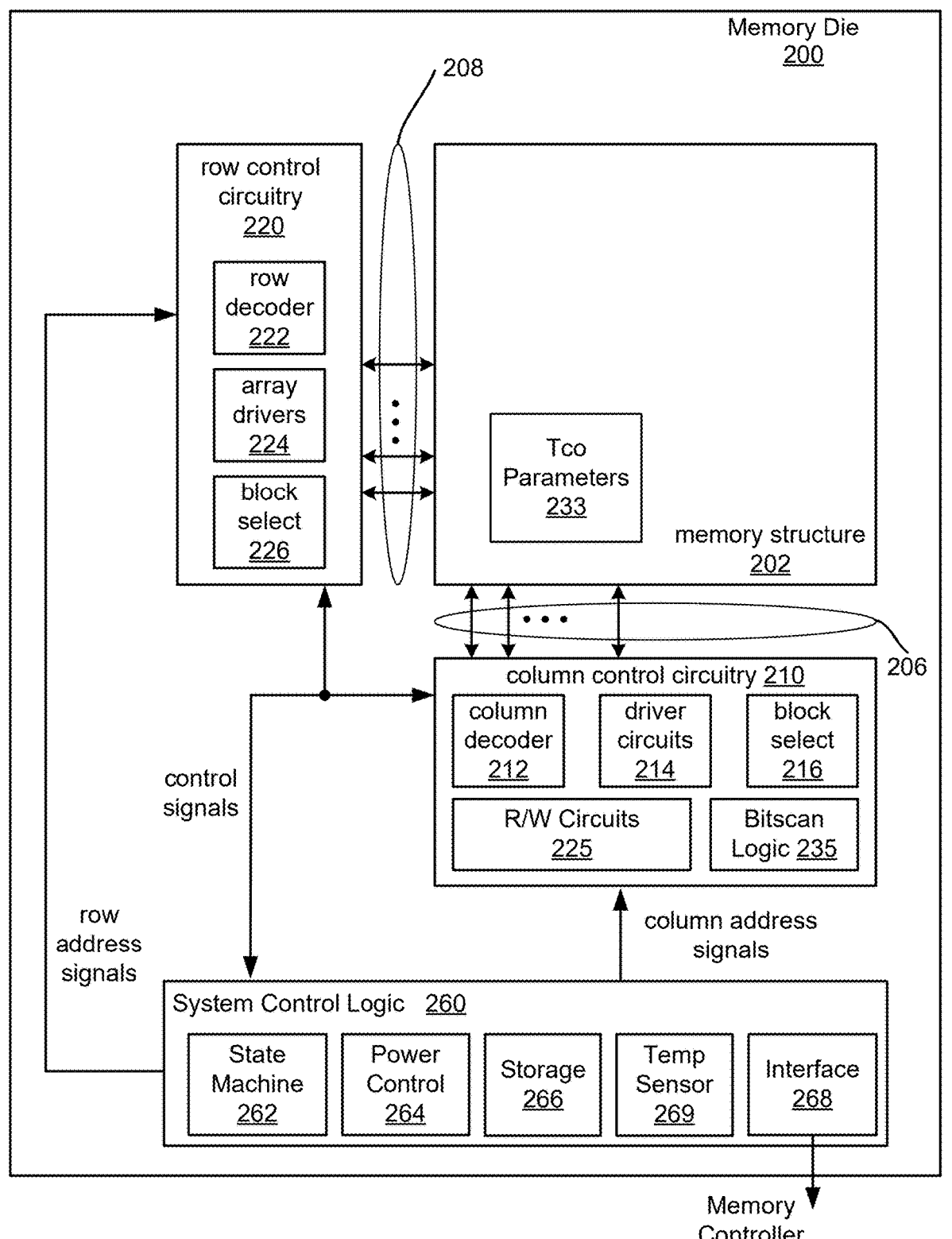
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below.

The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In some embodiments, the system control logic 260 (which comprises one or more electrical circuits)

includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

The memory structure 202 may store Tco parameters 233. In an embodiment, the Tco parameters 233 are re-calibrated based on an amount of data retention impact on NAND memory cells since those cells were programmed. In an embodiment, the Tco parameters 233 include a bit line voltage Tco. The bit line voltage Tco is used to calculate a magnitude for a bit line voltage based on a present temperature. The memory system has one or more temperature (temp) sensors 269. An example location for a temperature sensor 269 is depicted in the system control logic 260, but the temperature sensor 269 could be located elsewhere in the storage system 100. In an embodiment, the bitscan logic 235 is used to determine a shift in a Vt distribution. The shift in a Vt distribution may be determined based on a count ("bitscan count") of memory cells having a Vt within a Vt range associated with a Vt distribution, such as a lower tail of the Vt distribution. A shift in Vt of a particular Vt distribution may be used to determine an amount of data retention impact on NAND memory cells since those cells were programmed. In an embodiment, the bitscan count is used to re-calibrate a Tco. The Tco may be used to determine a voltage to apply to the memory structure 202 during read. In an embodiment, the bitscan count is used to re-calibrate a bit line voltage Tco. In an embodiment, the bitscan count is used to re-calibrate a Vread Tco. The term "Vread" refers to a voltage that is applied to unselected word lines during sensing of memory cells. The Vread may be referred to as a "pass voltage," as Vread has a sufficient magnitude to turn on the "unselected memory cells" connected to unselected word lines. Note that having bitscan logic 235 on the memory chip alleviates the need to transfer the data to the memory controller 120 to re-calibrate the Tco. However, optionally the memory controller 120 may take part in the dynamic updates to the read levels.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of memory system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the memory system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
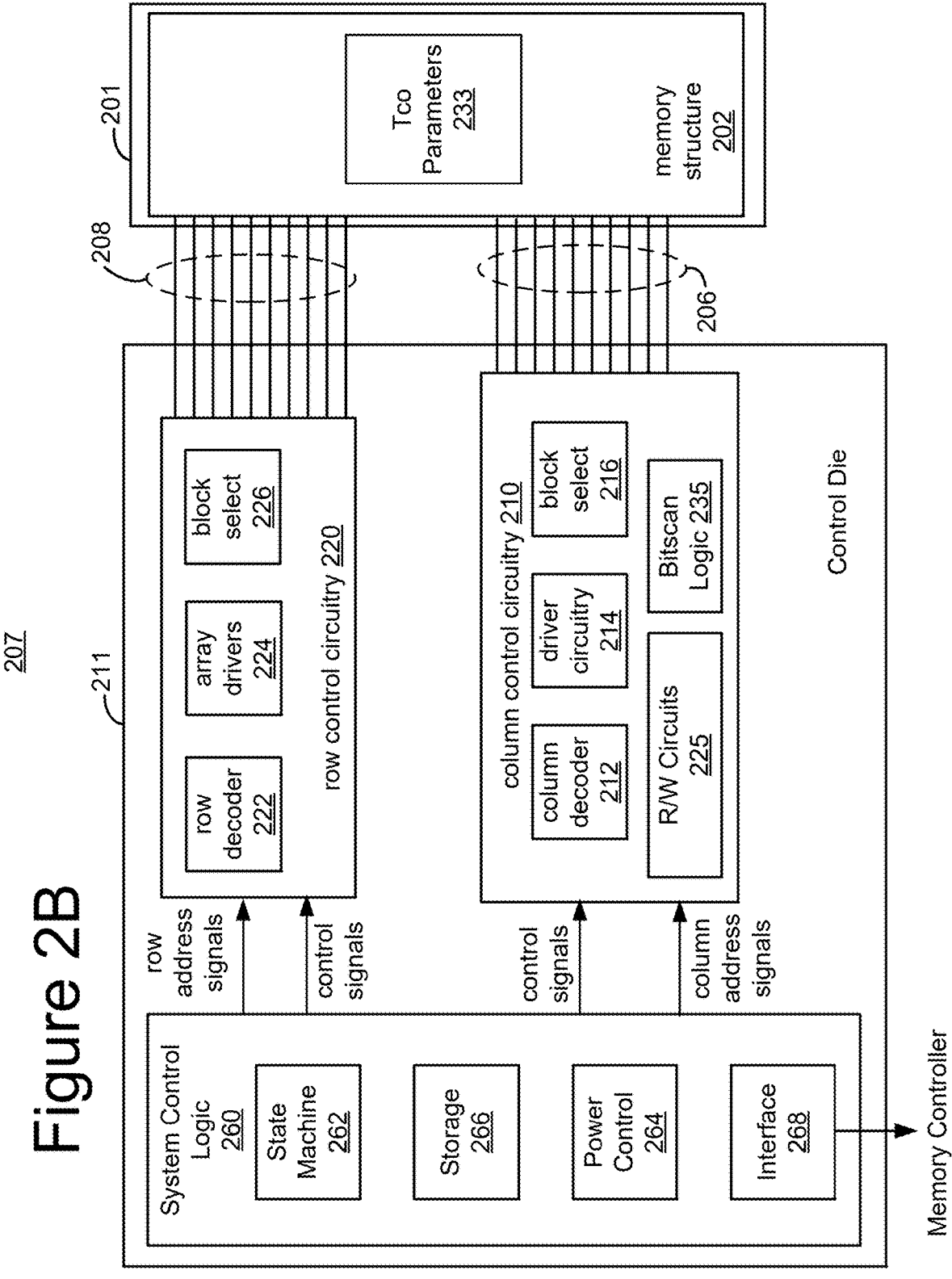
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of memory system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, memory system 100, storage 130, memory die 200, integrated memory assembly 207, and/or control die 211.

Figure 3A:
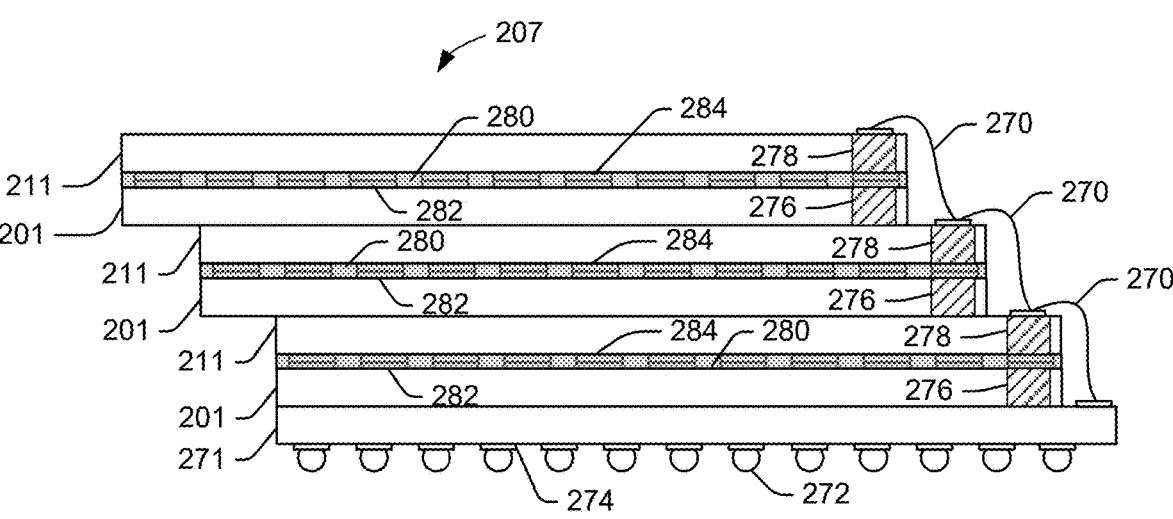
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
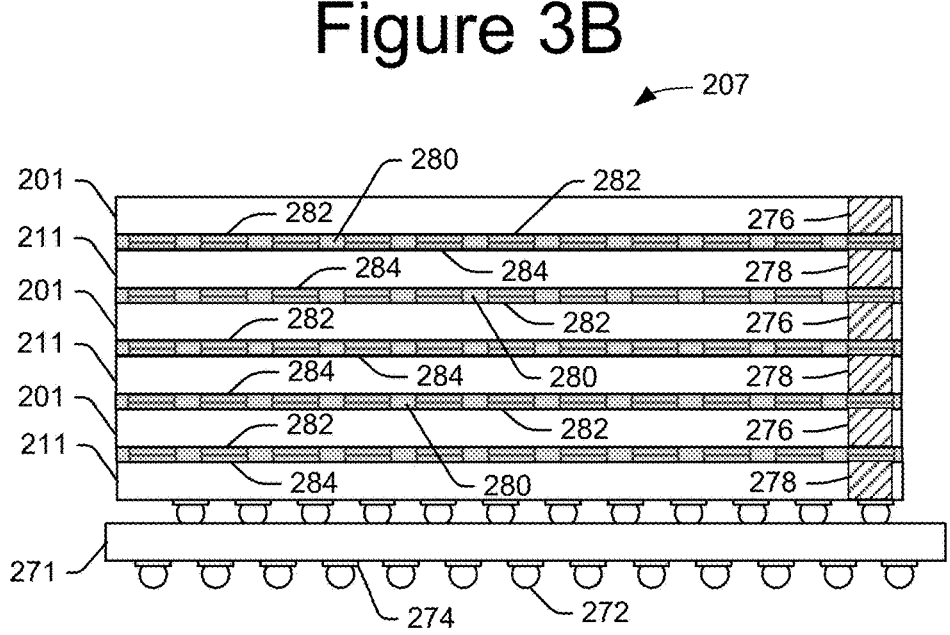

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
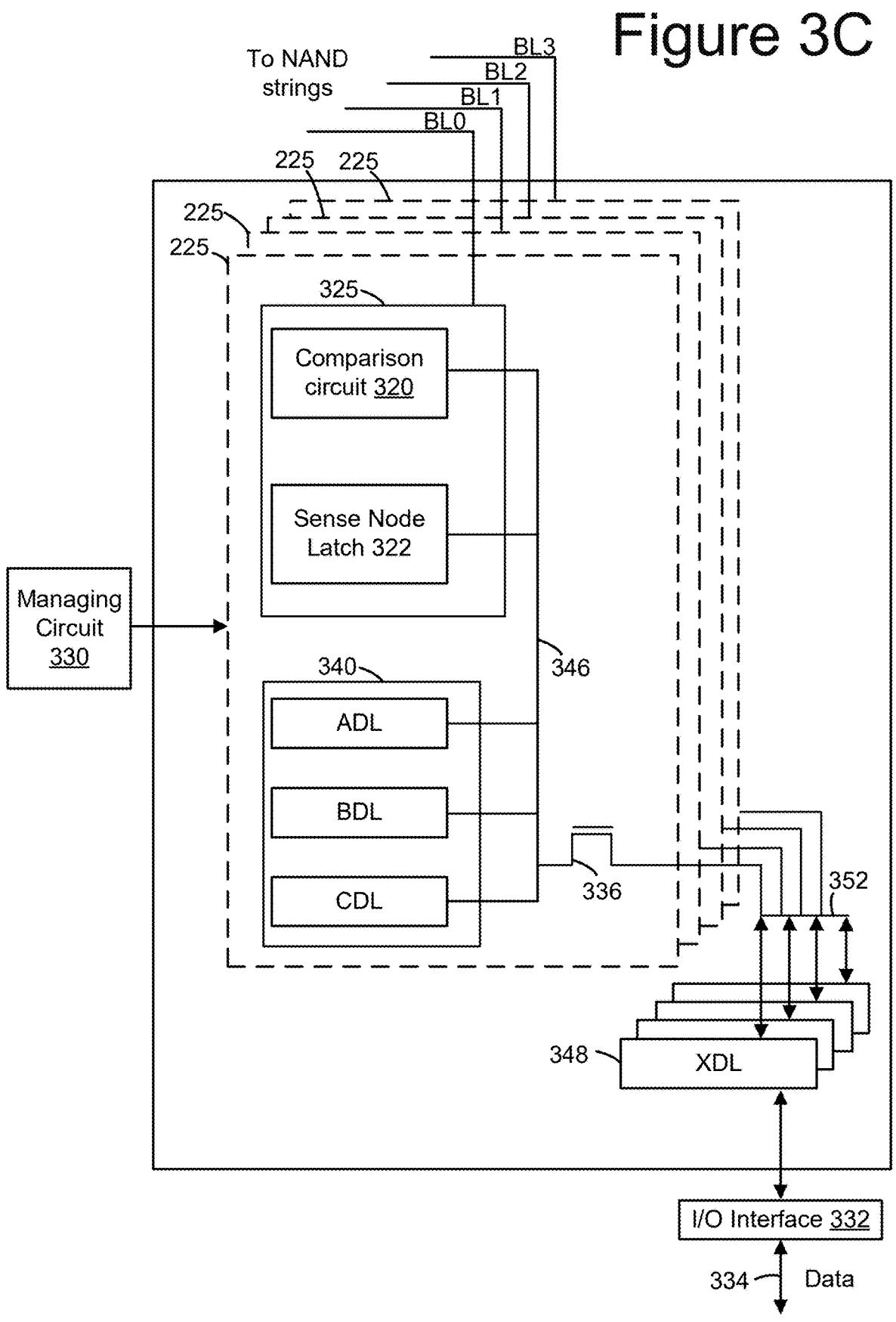
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier. The following will discuss use of the sense amplifier 325 to sense a condition (e.g., data state) of a memory cell.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
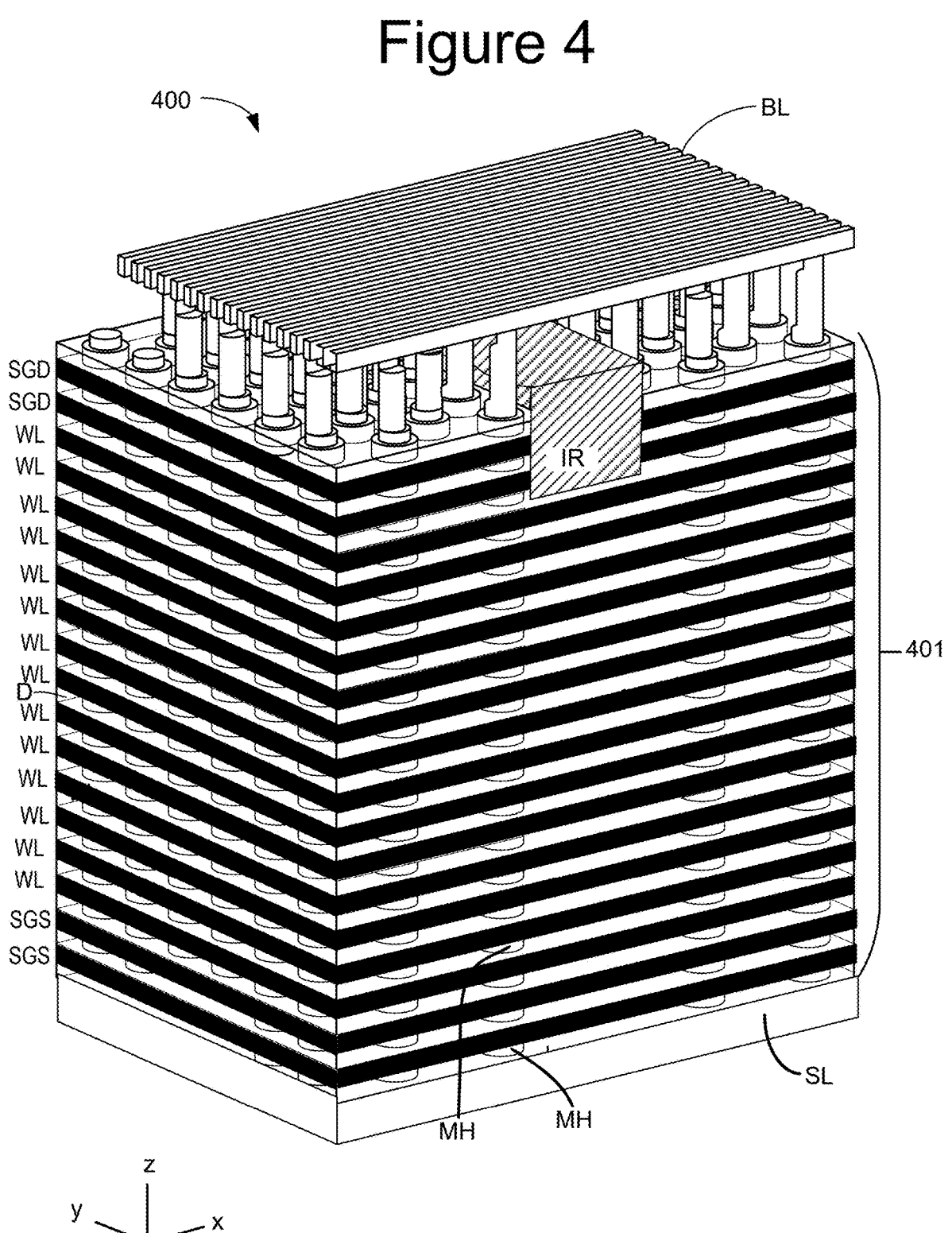
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of:

SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of "sub-blocks." Each of these "sub-blocks" has many NAND strings. In an embodiment, an isolation region (IR) divides the SGD layers into multiple SGD select lines, each of which is used to select a sub-block (e.g., set of NAND strings). FIG. 4 depicts an example having one IR region and thereby two sub-blocks. However, there may be more than one IR region and thereby more than two sub-blocks. Optionally, the IR region can extend downward through all of the alternating dielectric layers and conductive layers.

Figure 4A:
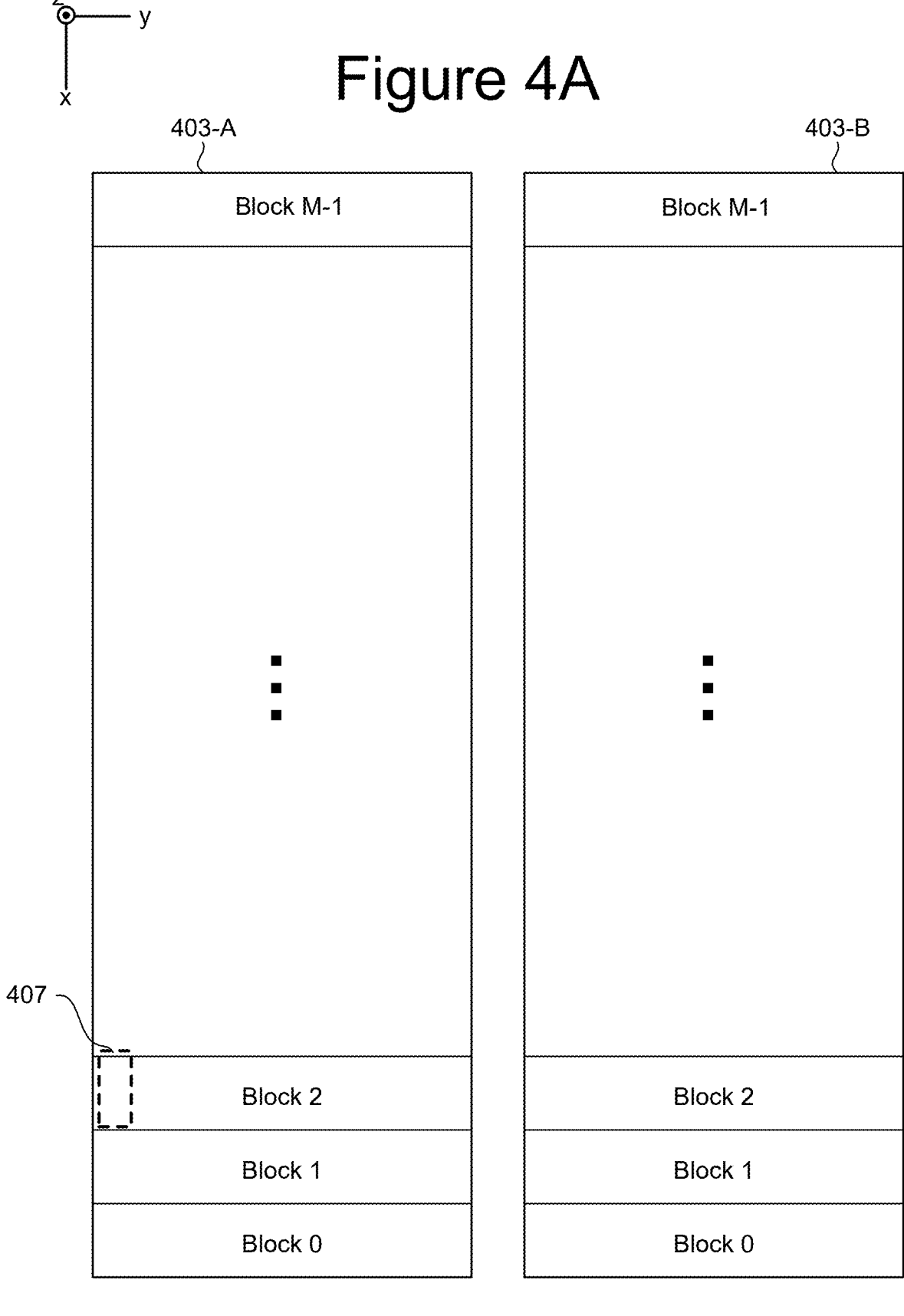
FIG. 4A is a block diagram of one embodiment of a memory structure having two planes.

FIG. 4A is a block diagram explaining one example organization of memory structure 202, which is divided into two planes 403-A and 403-B. Each plane 403 is then divided into M physical blocks. In one example, each plane has about 2000 physical blocks (or more briefly "blocks"). However, different numbers of blocks and planes can also be used. In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. In an embodiment, each plane 403-A, 403-B has a set of bit lines that extend across all of the blocks in that plane. In an embodiment, one block per plane is selected at a time. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403-A, 403-B more or fewer than two planes can be implemented. In some embodiments, memory structure 202 includes four planes. In some embodiments, memory structure 202 includes eight planes. In some embodiments, programming can be performed in parallel in a first selected block in plane 403-A and a second selected block in plane 403-B.

Figure 4B:
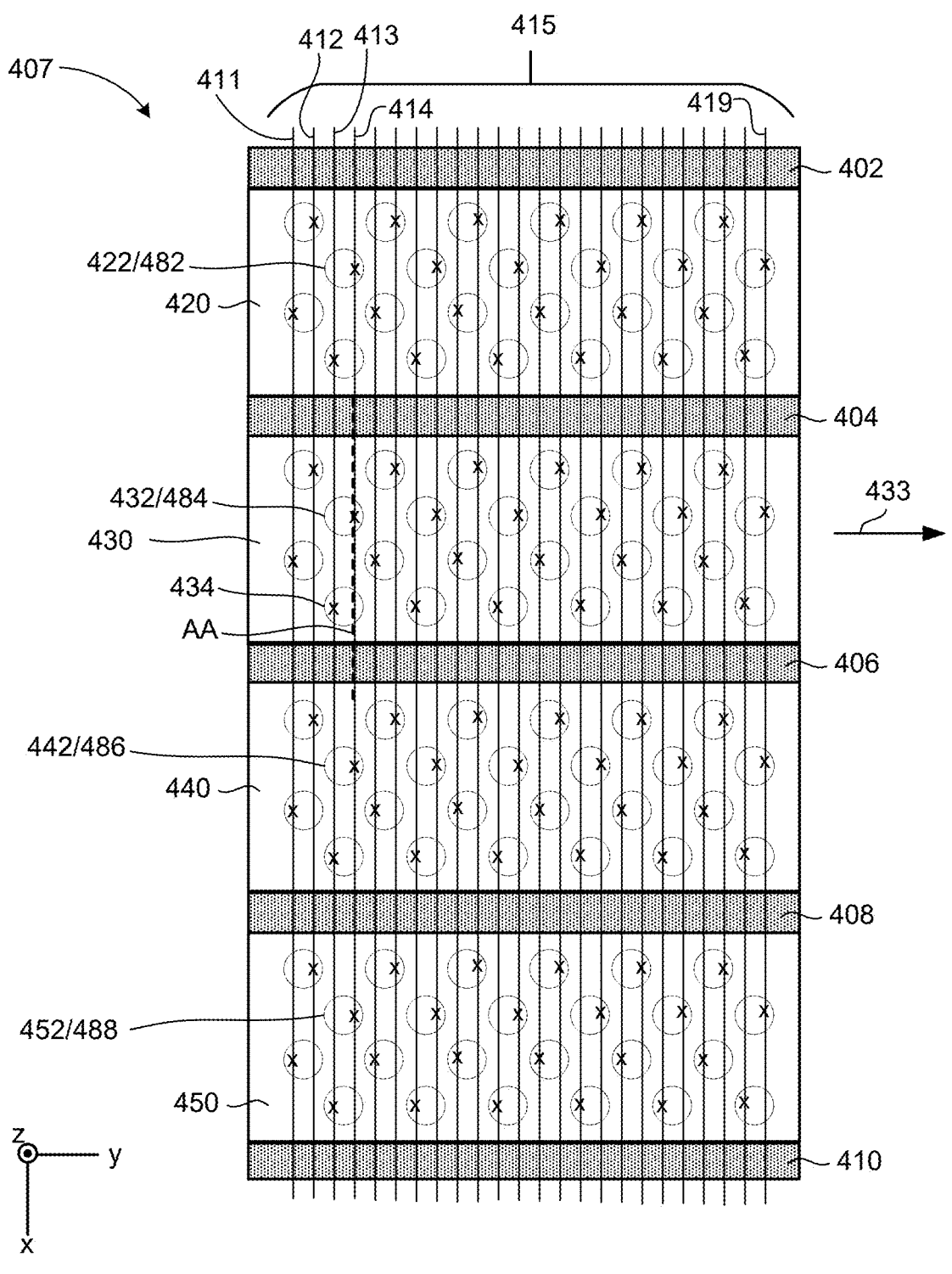
FIG. 4B is a block diagram depicting a top view of a portion of block of memory cells showing an array region.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of SiO$_2$; however, other dielectric materials can also be used. Isolation regions 402, 404, 406, 408, and 410 serve to divide the top layers of the physical block into four regions; for example, the top layer depicted in FIG. 4B is divided into regions 420, 430, 440, and 450, which are referred to herein as "sub-blocks. Each sub-block contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/ NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
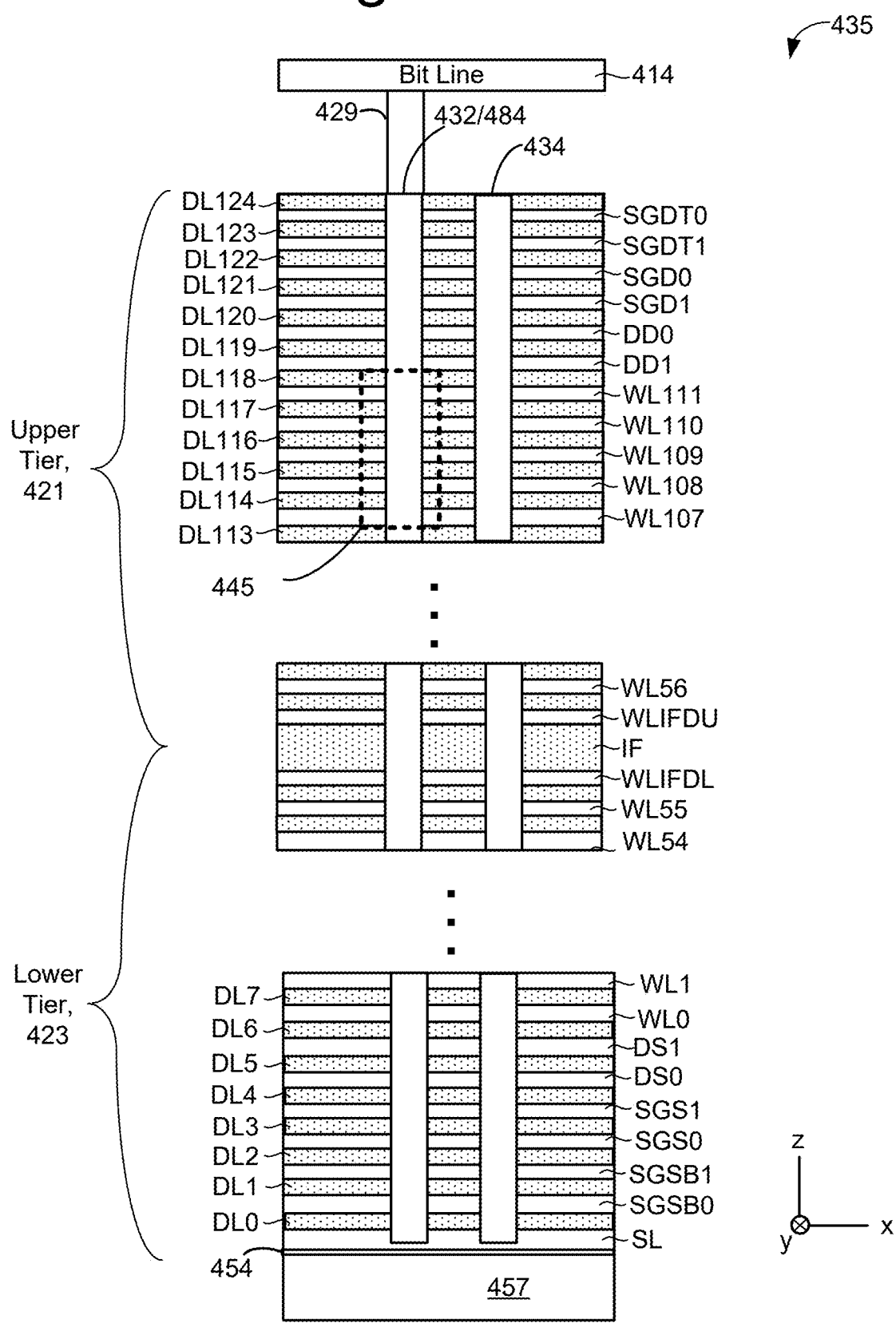
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than six dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 429 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers (lower tier 423, upper tier 421). A two tier or other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the tiers are erased independent of one another. Hence, data may be maintained in the upper tier 421 after the lower tier 423 is erased. Likewise, data may be maintained in the lower tier 423 after upper tier 421 is erased.

Figure 4D:
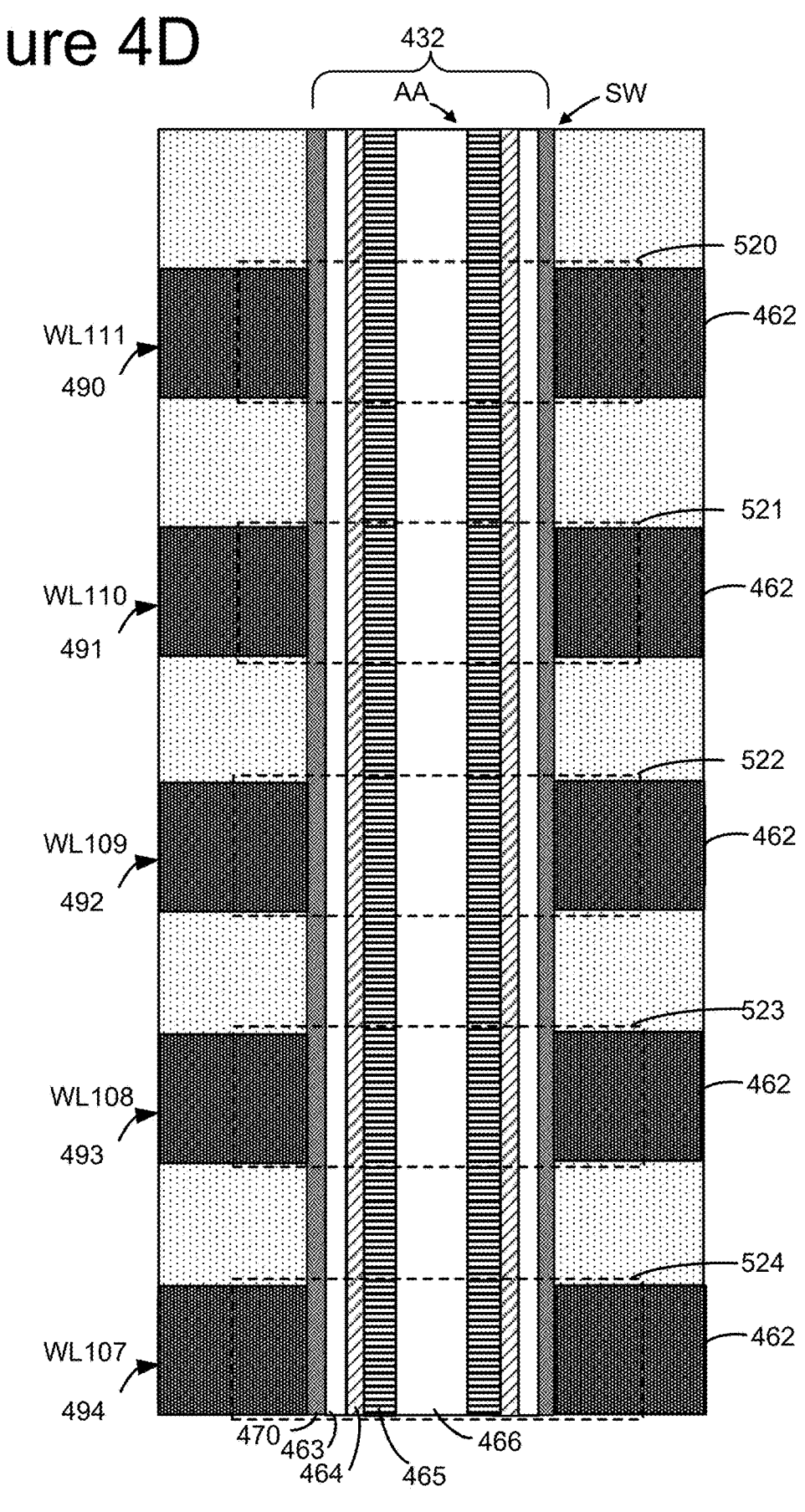
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
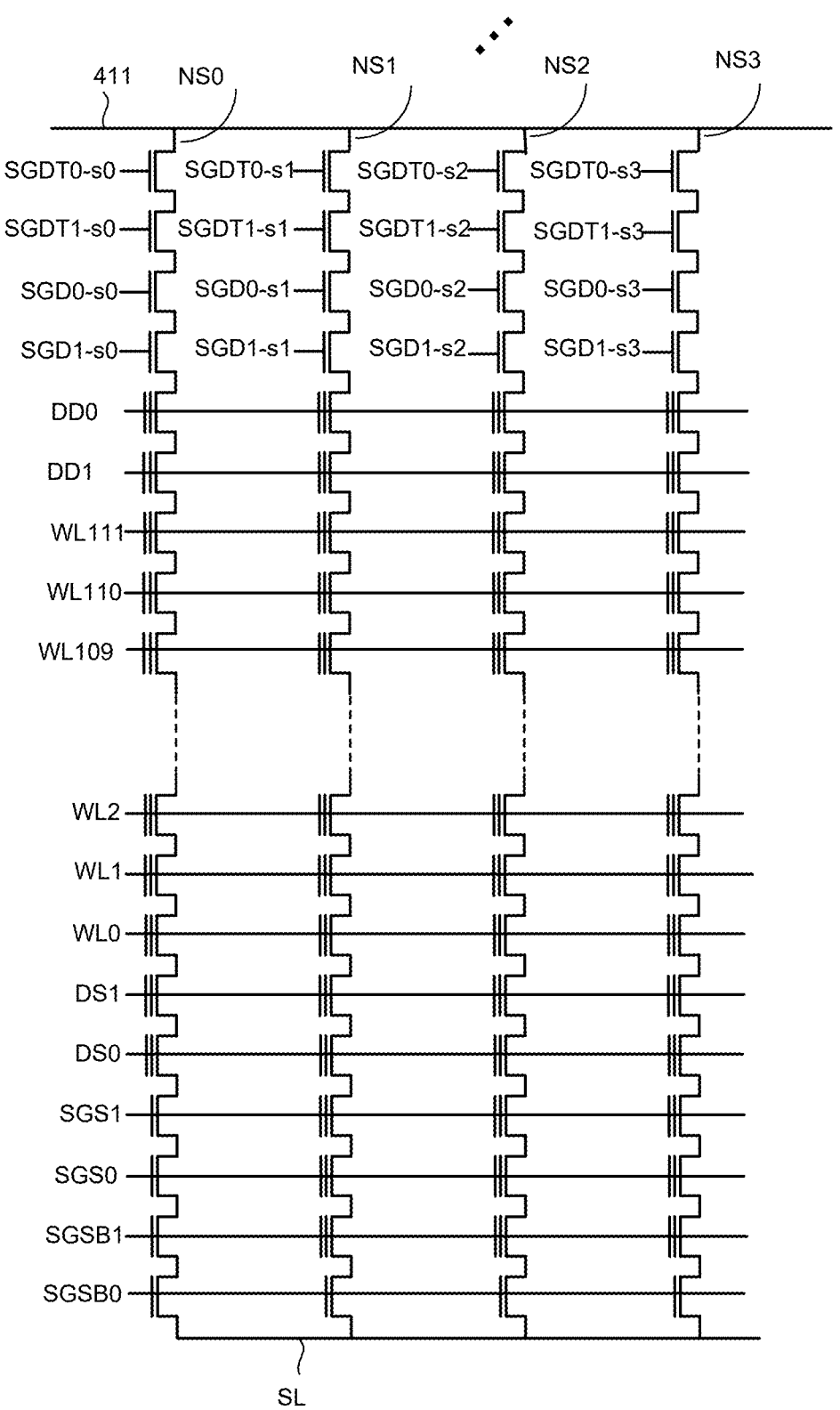
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND string NS3.

In one embodiment, there are four sets of drain side select lines in the physical block. For example, the set of drain side select lines connected to NS0 include SGDT0-*s*0, SGDT1-*s*0, SGD0-*s*0, and SGD1-*s*0. The set of drain side select lines connected to NS1 include SGDT0-*s*1, SGDT1-*s*1, SGD0-*s*1, and SGD1-*s*1. The set of drain side select lines connected to NS2 include SGDT0-*s*2, SGDT1-*s*2, SGD0-*s*2, and SGD1-*s*2. The set of drain side select lines connected to NS3 include SGDT0-*s*3, SGDT1-*s*3, SGD0-*s*3, and SGD1-*s*3. Herein the term "SGD" may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four "sub-blocks." A first sub-block corresponds to those vertical NAND strings controlled by SGDT0-*s*0, SGDT1-*s*0, SGD0-*s*0, and SGD1-*s*0. A second sub-block corresponds to those vertical NAND strings controlled by SGDT0-*s*1, SGDT1-*s*1, SGD0-*s*1, and SGD1-*s*1. A third sub-block corresponds to those vertical NAND strings controlled by SGDT0-*s*2, SGDT1-*s*2, SGD0-*s*2, and SGD1-*s*2. A fourth sub-block corresponds to those vertical NAND strings controlled by SGDT0-*s*3, SGDT1-*s*3, SGD0-*s*3, and SGD1-*s*3. As noted, FIG. 4E only shows the NAND strings connected to bit line 411. However, a full schematic of the block would show every bit line and four vertical NAND strings connected to each bit line.

Although the example memories of FIGS. 4-4E are three dimensional memory structure that includes vertical NAND strings with charge-trapping material, other 3D memory structures can also be used with the technology described herein.

Figure 5:
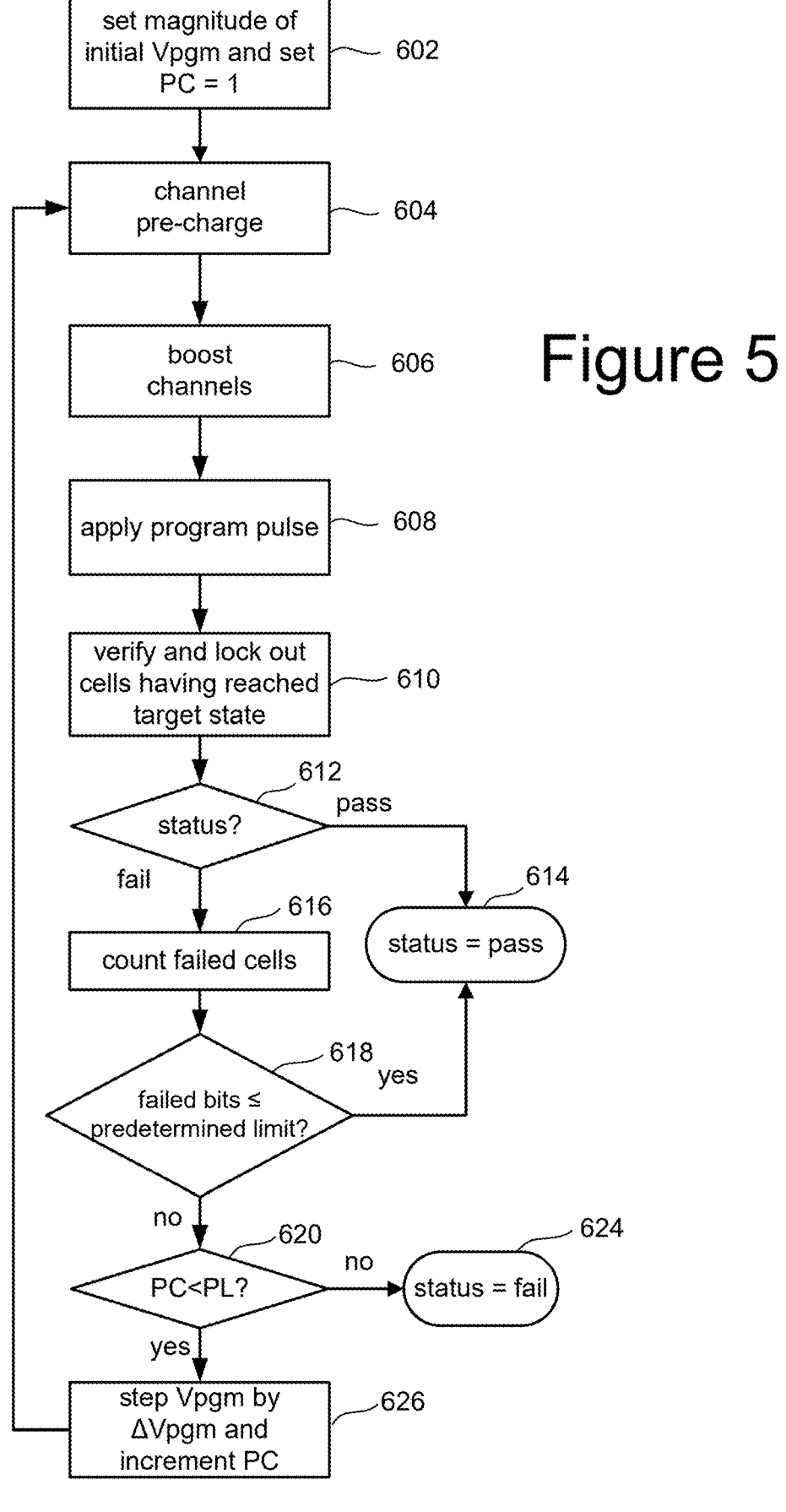
FIG. 5 is a flowchart describing one embodiment of a process for programming memory cells.

The storage systems discussed above can be erased, programmed and read. FIG. 5 is a flowchart describing one embodiment of a process for programming memory cells. For purposes of this document, the term program and programming are synonymous with write and writing. In one example embodiment, the process of FIG. 5 is performed for memory structure 202 using the one or more control circuits (e.g., system control logic 260, column control circuitry 210, row control circuitry 220) discussed above. In one example embodiment, the process of FIG. 5 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 5 is performed to implement the full sequence programming, as well as other programming schemes including multi-stage programming. When implementing multi-stage programming, the process of FIG. 5 is used to implement any/each stage of the multi-stage programming process.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. In many implementations, the magnitude of the program pulses is increased with each successive pulse by a predetermined step size. In step 602 of FIG. 5, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 5 is performed.

At the end of a successful programming process, the threshold voltages of the memory cells should be within one or more distributions of threshold voltages for programmed memory cells or within a distribution of threshold voltages for erased memory cells, as appropriate. FIG. 6A a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 6A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 6A depicts read reference voltage Vr. By testing (e.g., performing one or more sense operations) whether the threshold voltage of a given memory cell is above or below Vr, the system can determine whether a memory cell is erased (state E) or programmed (state P). FIG. 6A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 6B, each memory cell stores three bits of data. Other embodiments may use other data capacities per memory cell (e.g., such as two, four, or five bits of data per memory cell).

FIG. 6B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 6B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 6B also shows a number of verify reference voltages. The verify reference voltages are VvA, VvB, VvC, VvD, VVE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6C:
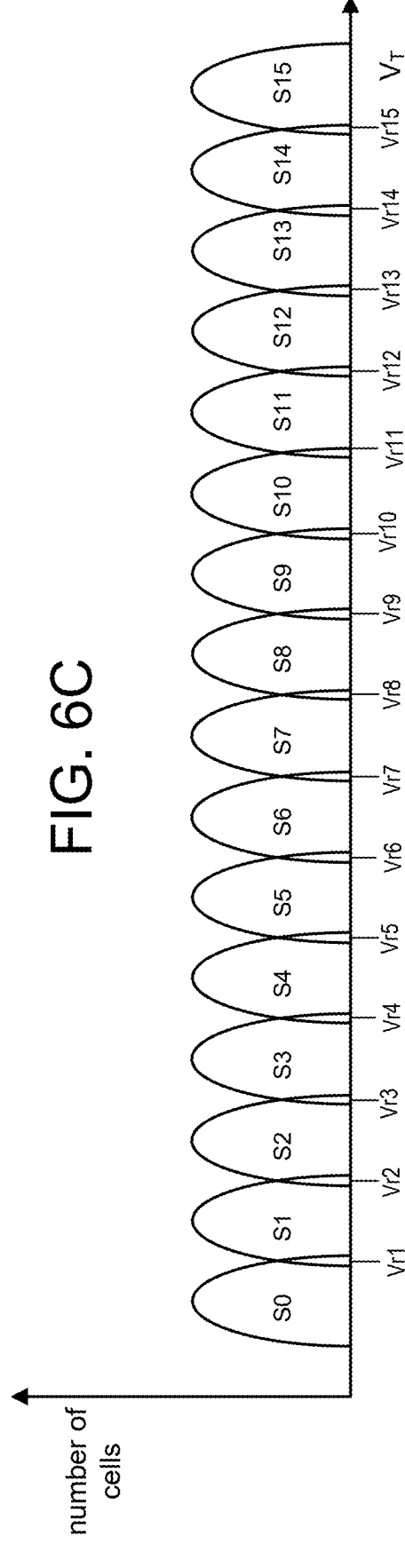

FIG. 6C illustrates example threshold voltage distributions for the memory array when each memory cell stores four bits of data. Other embodiments, however, may use other data capacities per memory cell (e.g., such as one, two, three, or five bits of data per memory cell). FIG. 6C shows 15 read reference voltages, Vr1-Vr15 for reading data from memory cells. The set of memory cells may be connected to the same word line. Each read reference level is used to distinguish between two adjacent threshold voltage distributions. Stated another way, each read reference level is used to distinguish between two adjacent data states. For example, read reference level Vr4 is used to distinguish between data states S3 and S4. Each read reference voltages Vr1-Vr15 used to distinguish between two adjacent threshold voltage distributions may be referred to herein as a "hard bit" reference voltage. By testing (e.g., performing sense operations) whether the threshold voltage of a given memory cell is above or below the 15 read reference voltages, the system can determine what data state (i.e., S0, S1, S2, S3 . . . ) a memory cell is in.

FIG. 6C depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11 to read one of the pages.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 6C depicts that there may be some overlap between the data states S0-S15. The overlap may occur due to factors such as memory cells changing charge over time, which is referred to herein as a data retention issue (or more briefly "data retention"). Some states tend to lose charge over time, and therefore may exhibit a drop in Vt over time. However, other states could gain charge over time, and therefor exhibit an increase in Vt over time. For some NAND memory cells there is a neutral Vt, which is a Vt that the memory cell will tend to move towards over time. Memory cells programmed to a Vt above the neutral Vt may tend to see a drop in Vt over time. Memory cells programmed to a Vt below the neutral Vt may tend to see an increase in Vt over time.

Figure 7A:
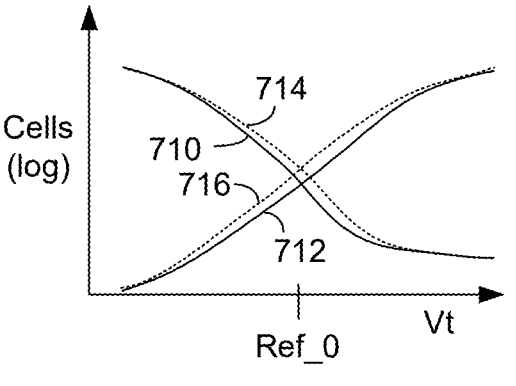
FIGS. 7A and 7B depict portions of threshold voltage distributions of two adjacent data states.
Figure 7B:
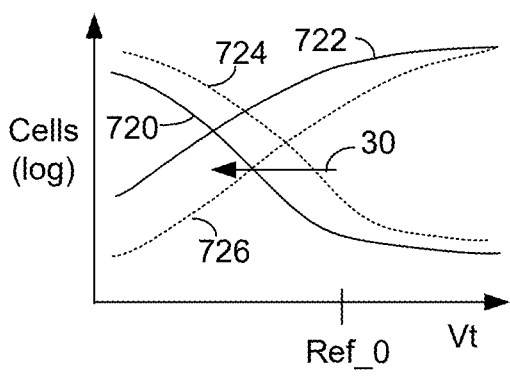

FIGS. 7A and 7B depict portions of threshold voltage distributions of two adjacent data states. FIG. 7A depicts the threshold voltage distributions immediately after programming. FIG. 7B depicts the threshold voltage distributions after some time has passed, leading to a data retention impact. For each diagram, nominal temperature and a high temperature examples are depicted. The two states will be referred to as a lower state and an upper state, which may be any two adjacent states. In some cases, the higher Vt distributions show greater data retention issues.

Referring now to FIG. 7A, the solid line curves 710, 712 are for the nominal temperature and the dashed curves 714, 716 are for high temperature as read with temperature compensation. Curve 710 is the upper tail of the nominal temperature for the lower state. Curve 712 is the lower tail for the nominal temperature for the higher state. Curve 714 is the upper tail for the high temperature for the lower state temperature as read with temperature compensation. Curve 716 is the lower tail for the high temperature for the higher state temperature as read with temperature compensation. The reference level Ref_0 is the read level for distinguishing between the lower state and the higher state. The reference level Ref_0 is very close to the valley between the lower state and the upper state and results in a low fail bit count (FBC) for both the nominal temperature and the high temperature with temperature compensation. In this example, the temperature compensation is set based on the fresh Vt distributions immediately after programming. Note that in practice the temperature compensation factor may be also used when reading at the nominal temperature; however, the temperature compensation may be configured to have no effect at the nominal temperature. Significantly, the temperature compensation provides the lowest fail bit count across a wide range of temperatures, assuming that the memory cells are read when freshly programmed.

Referring now to FIG. 7B, the solid line curves 720, 722 are for the nominal temperature and the dashed curves 724, 726 are for high temperature with the same temperature compensation as was used for the freshly programmed cells. Curve 720 is the upper tail for the nominal temperature for the lower state. Curve 722 is the lower tail for the nominal temperature for the higher state. Curve 724 is the upper tail for the high temperature for the lower state. Curve 726 is the lower tail for the high temperature for the higher state with the same temperature compensation as was used for the freshly programmed cells. Arrow 30 shows the downward shift in Vt for the nominal temperature Vt distributions 710 and 712. Thus, at nominal temperature the read level should be lowered to produce optimal read results (e.g., lowest FBC). Significantly, the valley between the nominal temperature Vt distributions 720, 722 is quite different than the valley between the high temperature Vt distributions 724, 726. Therefore, the high temperature read should use a different reference level than the nominal temperature read, given the amount of temperature compensation that is applied. Again, in this example, the amount of temperature compensation was determined based on the freshly programmed memory cells (see FIG. 7A).

Figure 8A:
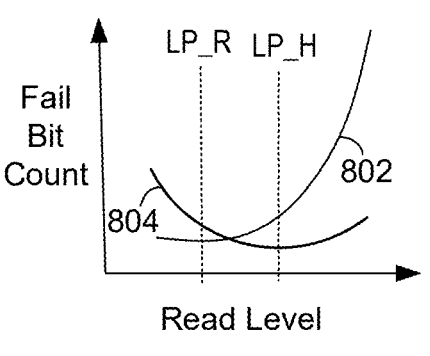
FIGS. 8A, 8B, and 8C depict an example of a valley search for optimum read levels after data retention.
Figure 8B:
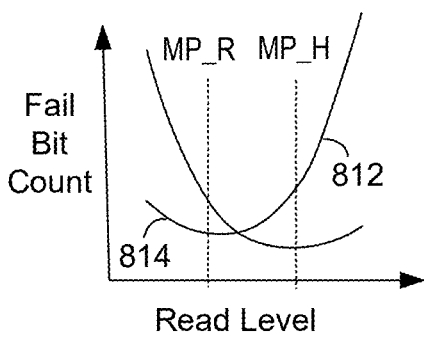
Figure 8C:
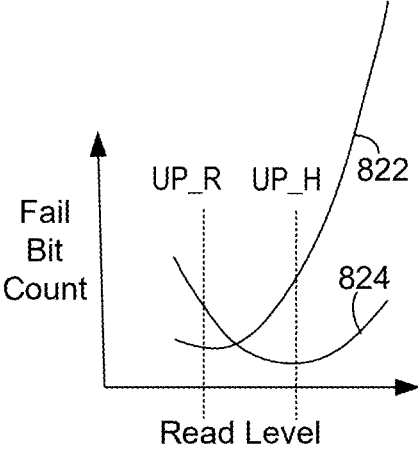

FIGS. 8A, 8B, and 8C depict an example of a valley search for optimum read levels after data retention. Data for nominal temperature and high temperature are depicted. In this example, the amount of temperature compensation was determined based on the freshly programmed memory cells. As will be described below, the target read levels are different for nominal temperature and high temperature with the temperature compensation that was determined based on the freshly programmed memory cells. In this example, the memory cells store three bits per cell in a lower page (LP), middle page (MP), and an upper page (UP). In FIG. 8A, curve 802 is the FBC versus read level for the nominal temperature and curve 804 is the FBC versus read level for the high temperature. The dashed line LP R is the read level for the lowest FBC for the nominal temperature curve 802 and dashed line LP_H is the read level for the lowest FBC for the high temperature curve 804. In FIG. 8B, curve 812 is the FBC versus read level for the nominal temperature and curve 814 is the FBC versus read level for the high temperature for the middle page. The dashed line MP R is the read level for the lowest FBC for the nominal temperature curve 812. The dashed line MP H is the read level for the lowest FBC for the high temperature curve 814. In FIG. 8C, curve 822 is the FBC versus read level for the nominal temperature and curve 824 is the FBC versus read level for the high temperature for the upper page. The dashed line UP R is the read level for the lowest FBC for the nominal temperature curve 822 and dashed line UP His the read level for the lowest FBC for the high temperature curve 824 for the upper page. For all three pages the best read level (lowest FBC) is lower for the nominal temperature than for the high temperature. Thus, after the data retention time, the target read level is different for high temperature than for nominal temperature, assuming the temperature compensation that was established based on freshly programmed memory cells.

FIGS. 7A-8C illustrate that these read techniques suffer from the use of temperature compensation that is determined exclusively based on freshly programmed memory cells. Other read techniques may also suffer in a similar manner from the use of temperature compensation that is determined exclusively based on freshly programmed memory cells. Embodiments of a memory system re-calibrate a Tco based on a data retention impact on memory cells, which improves the accuracy of the Tco. Therefore, the Tco is more accurate across a wider range of data retention times.

FIG. 9 is a graph of an example of NAND memory cell current versus temperature for different data retention times. Curve 902 is for freshly programmed NAND memory cells. Curve 904 is for NAND memory cell current after a first amount of data retention time. Curve 906 is for NAND memory cell current after a second amount of data retention time that is significantly greater than the amount of data retention time. In all three cases the NAND memory cell current increases with higher temperature. Moreover, in all three cases the NAND memory cell current increases with greater data retention time. Note that the greater data retention time results in a greater data retention impact on the NAND memory cells.

The memory cell current (for a default read conditions) is I1 at room temperature (RT). The memory cell current (for the default read conditions) is 12 at high temperature (HT). One possible technique for providing temperature compensation is to change the read conditions at high temperature to force the memory cell current to I1. One possible technique is to change the bit line voltage during read. The magnitude of the bit line voltage impacts the amount of drain induced barrier lowering (DIBL), which in turn impacts the magnitude of the memory cell current. As one example the bit line voltage may be lowered to lower the memory cell current. Thus, the memory system may determine a bit line Tco based on the RT curve 902. However, note that the slopes of DR curve 904 and the longer DR curve 906 are different from the RT curve 902. Therefore, the bit line Tco determined based on freshly programmed cells may not provide the proper temperature compensation for memory cells that have significant data retention times.

Equation 1 represents an example of calculating a bit line voltage from a bit line Tco (VLBC_TCO).

$$V\_BL\_New = V\_BL\_Base + VBLC\_TCO * (T - 85C) \qquad \text{Eq. 1}$$

In this example, 85 degrees Celsius is the nominal temperature and "T" is the present temperature in degrees Celsius. Therefore, at 85 degrees the bit line voltage will be the base bit line voltage (V_BL_Base). In some aspects, VBLC_TCO has a negative value such that when the temperature is greater than 85 C the new bit line voltage will be less than the base bit line voltage. However, assuming VBLC_TCO has a negative value then if the temperature is less than 85 C the new bit line voltage will be greater than the base bit line voltage. The value of 85 C is one example and can be higher or lower.

FIGS. 10A, 10B, and 10C are band diagrams of NAND memory cells corresponding to the three data retention times in FIG. 9. FIG. 10A shows the band diagram for the freshly programmed NAND memory cells (PD). FIG. 10B shows the band diagram for the first amount of data retention (DR). FIG. 10C shows the band diagram for the second amount of data retention (Longer DR). The channel region may be formed from polysilicon (see, for example, polysilicon body or channel 465 in FIG. 4D). The word line may be formed from a metal, such as tungsten. The region between the channel and the word line comprises a number of layers (see, for example, FIG. 4D, which shows blocking oxide/block high-k material 470, charge-trapping layer or film 463 such as SiN or other nitride, and tunneling layer 464). The channel region may become more conductive with increasing data retention time, which is reflected by the bending of the energy bands in FIGS. 10B and 10C, relative to FIG. 10A. In FIG. 10A, the Fermi level 1002 for the channel is far from the conduction band 1004. In FIG. 10C, the Fermi level 1002 for the channel is close to the conduction band 1004, wherein the channel may act like a conductor.

Figures 11A, 11B:
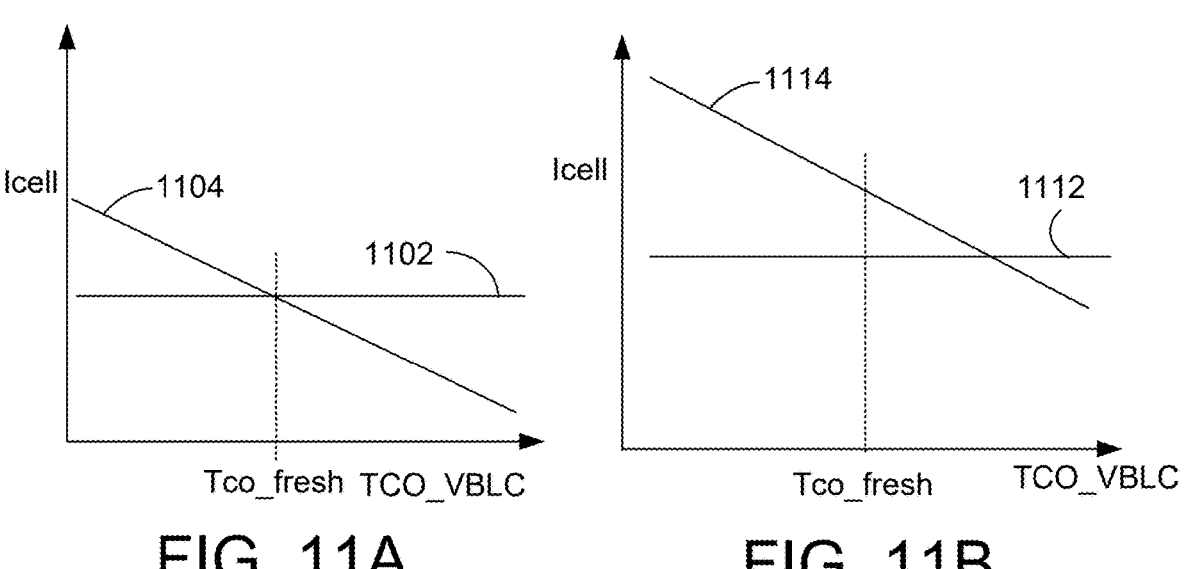
FIGS. 11A, 11B, and 11C depict an example of TCO_VBLC changing with data retention time.
Figure 11C:
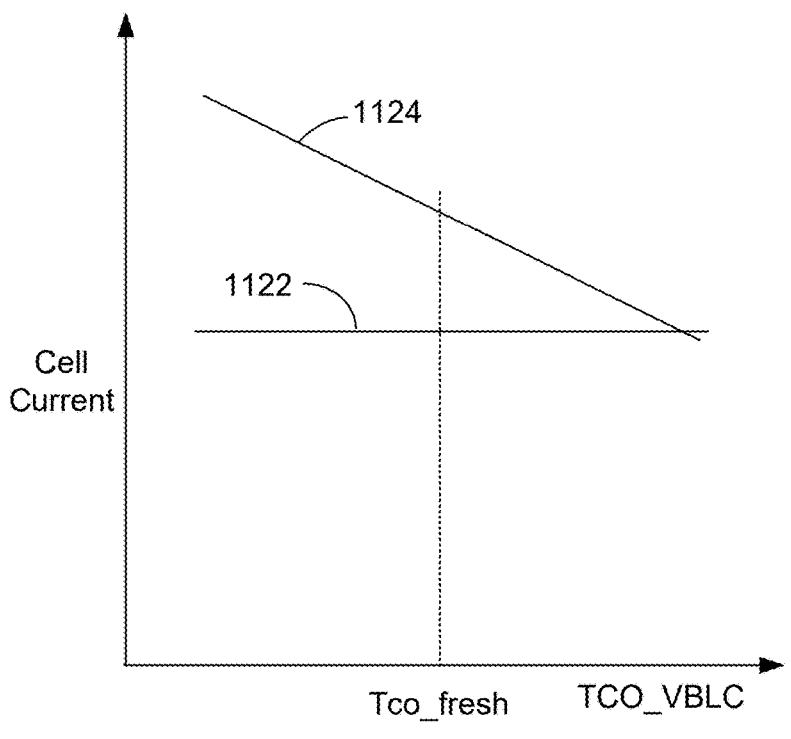

FIGS. 11A, 11B, and 11C depict an example of TCO_VBLC changing with data retention time. Each of these three Figures depicts NAND memory cell current (Icell) versus a bit line voltage temperature coefficient (TCO_VBLC). Each Figure has a horizontal line for nominal temperature and a line with a negative slope for high temperature. FIG. 11A is for freshly programmed NAND memory cells and show nominal temperature line 1102 and high temperature line 1104. The dashed line marked "Tco_fresh" is at the crossover point of lines 1102 and 1104 and represents a calibration of the TCO_VBLC for freshly programmed NAND memory cells.

FIG. 11B is for NAND memory cells after a first data retention time and shows nominal temperature line 1112 and high temperature line 1114. The dashed line marked "Tco_fresh" represents the calibration of the TCO_VBLC for freshly programmed NAND memory cells. However, the cross-over point for nominal temperature line 1112 and high temperature line 1114 is well to the right of the Tco_fresh calibration for freshly programmed cells. FIG. 11C is for NAND memory cells after a second data retention time and shows nominal temperature line 1122 and high temperature line 1124. The dashed line marked "Tco_fresh" represents the calibration of the TCO_VBLC for freshly programmed NAND memory cells. However, the cross-over point for nominal temperature line 1122 and high temperature line 1124 is well to the right of the Tco_fresh calibration for freshly programmed cells. Also note that in FIGS. 11B and 11C, the high temperature lines (1114, 1124) each have a higher Icell at Tco_fresh relative to the low temperature lines (1112, 1122), indicating that the memory cell current will be higher than expected if the TCO_VBLC is calibrated for freshly programmed cells (e.g., Tco_fresh).

The movement to the right of the cross-over points may be explained by the increase in conductivity of the NAND channel with an increase in data retention time. Significantly, FIGS. 11A-11C show how the optimum value for TCO_VBLC depends on data retention time.

In an embodiment, the value of temperature coefficients including, but not limited to, TCO_VBLC are re-calibrated based on data retention time. Therefore, the memory system compensates for issues related to changes in NAND channel conductivity as a function of data retention time. Stated another way, the memory system compensates for issues related to changes in NAND memory cell current as a function of data retention time.

Figure 12:
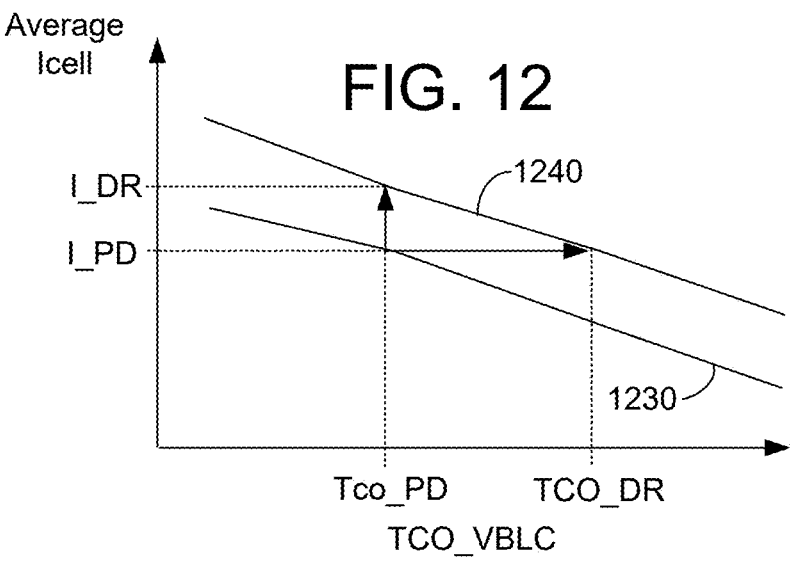
FIG. 12 is a graph depicting average NAND cell current (Icell) versus TCO_VBLC.

FIG. 12 is a graph depicting average NAND cell current (Icell) versus TCO_VBLC. Plot 1230 is for freshly programmed cells. Plot 1240 is for cells after some data retention time. Both plots 1230, 1240 are for the same temperature (e.g., 25 C). Tco_PD is an example of TCO_VBLC calibrated based on the freshly programmed cells. The memory cell current for the freshly programmed cells (plot 1230) is I_PD using Tco_PD. However, note that plot 1240 indicates that Icell will be significantly higher (I_PD) for the data retention case if Tco_PD is used. To obtain the same current (I_PD) for each case, for plot 1240 the value for TCO_VBLC would need to be TCO_DR (assuming Tco_PD is used for plot 1230). The foregoing further illustrates how the increase in NAND channel conductivity with increased DR time. The higher cell current (I_PD) for plot 1240 (for Tco_PD) indicates that the bit line voltage is too high after the data retention time. In an embodiment, in order to maintain the same Icell for freshly programmed cells and cells after some DR time, TCO_VBLC is shifted positive to counter the channel resistance lowering due to the DR impact. For example, TCO_VBLC may be shifted from Tco_PD to TCO_DR to counter the channel resistance lowering due to the DR impact.

Figure 13:
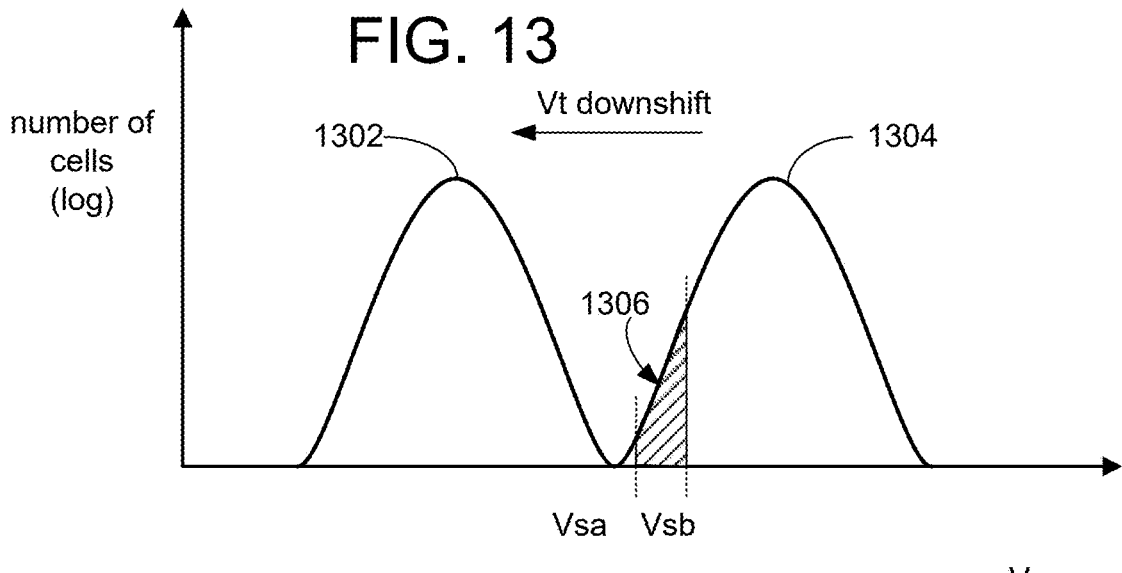
FIG. 13 show Vt distributions to illustrate how a bitscan may be performed to determine a shifts to Vt distribution.

There are a number of techniques that can be used to determine the impact to the NAND memory cells as a result of the data retention time. One technique is to analyze a shift in a Vt distribution based on a bitscan. FIG. 13 show Vt distributions to illustrate how a bitscan may be performed to determine a shifts to Vt distribution. In an embodiment, the bitscan may bs used to determine a temperature coefficient such as TCO_VBLC. FIG. 13 shows a case in which there has been a Vt downshift in the two Vt distributions 1302, 1304 since programming. The two Vt distributions 1302, 1304 may be any two adjacent Vt distributions. The NAND memory cells are sensed for a range of Vt between Vsa and Vsb. The memory system (e.g., bitscan logic 235) counts how many cells have a Vt between Vsa and Vsb, which is referred to herein as a bitscan. Thus, the memory system will determine how many NAND cells are in region 1306 of Vt distribution 1304. The count of memory cells is an indication of the amount of Vt shift, with a greater number of memory cells indicating a greater Vt shift. In one embodiment, the memory system determines how many memory cells have a different result for sensing at Vsb relative to Vsa, which may be referred to as a "mis-compare." Such mis-compares are determined to be in region 1306. For example, a memory cell having a Vt in region 1306 should fail to turn on in response to Vsa, but should turn on in response to Vsb. The sensing at the two levels can be achieved using different techniques. One technique is to use the same sense time (integration time) for both levels, but to use different control gate voltages. Another technique is to use the same control gate voltage for each level, but to use different sense times (integration times) for each level.

Figure 14:
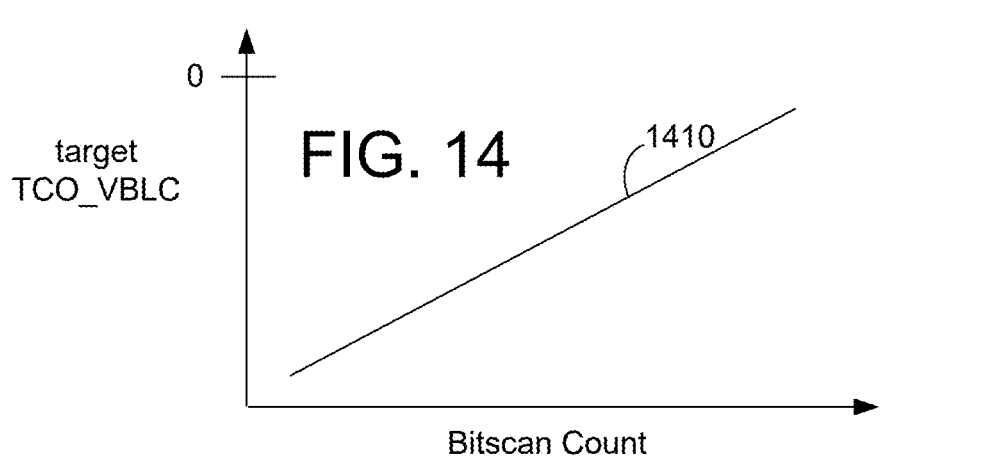
FIG. 14 is a graph depicting target TCO_VBLC versus bitscan count.

FIG. 14 is a graph depicting target TCO_VBLC versus bitscan count. Plot 1410 is thus target TCO_VBLC versus bitscan count. In this example, most (or all) of the TCO_VBLC values are negative. The value for TCO_VBLC becomes greater (e.g., less negative) with increasing bitscan count, for the range of data depicted. A technique other than bitscan count may be used to determine the data retention impact on the NAND memory cells. Thus, instead of the x-axis being "Bitscan count," the x-axis could be some other measure of data retention impact on the NAND memory cells. For example, a technique other than a bitscan may be used to determine the downshift of the Vt distribution 1304.

FIG. 15 is a flowchart of one embodiment of a process 1500 of reading NAND memory cells using a Tco based on an amount of data retention impact. In some embodiments, the process 1500 is performed entirely on either the memory die 200 or the integrated memory assembly 211. In some embodiments, the memory controller 120 is also involved with process 1500. Prior to process 1500 the group is programmed to a number of data states. In an embodiment, there is a Vt distribution associated with each data state. Examples include, but are not limited to, programming the group of NAND memory cells to eight data states (see FIG. 6B) or 16 data states (see FIG. 6C). The group of NAND memory cells could be programmed to more or fewer data states. Step 1502 includes measuring an amount of data retention impact to a data state to which the group was programmed since the group was programmed. In an embodiment, a bitscan of a lower tail of one of the Vt distributions is performed. In some embodiments, the Vt distribution that is selected is one that is expected to show a greater data retention impact. In some cases one of the highest Vt states is expected to show a greater data retention impact and is thus selected for measurement of data retention impact.

Step 1504 includes determining a temperature coefficient (Tco) based on the amount of data retention impact. In one embodiment, the Tco is based the amount of shift in the Vt distribution since programming. In one embodiment, the Tco is based the bitscan count. In one embodiment, the Tco includes a bit line voltage Tco. In one embodiment, the Tco includes a Vread Tco.

Step 1506 includes reading NAND memory cells based on the Tco that was determined in step 1504. The NAND memory cells may be the same group that was measured for data retention impact or a different group of NAND memory cells. In an embodiment, the group that is read is in the same block as the group that was measured for data retention impact. Note that memory cells in the same block are typically programmed at about the same time. In an embodiment, step 1506 includes applying a bit line voltage based on the bit line voltage Tco while reading the memory cells. In an embodiment, step 1506 includes applying a Vread voltage to unselected word lines based on the Vread Tco while reading the memory cells.

FIG. 16 is a flowchart of an embodiment of a process 1600 of reading NAND memory cells while applying a bit line voltage that is based on a Tco based on a shift to a Vt distribution. Process 1600 provides further details of one embodiment of process 1500. In some embodiments, the process 1600 is performed entirely on either the memory die 200 or the integrated memory assembly 211. In some embodiments, the memory controller 120 is also involved with process 1600. Step 1602 includes measuring an amount of shift to a Vt distribution of a group of memory cells since the group was programmed to the Vt distribution. In one embodiment a bit scan of the lower tail of the Vt distribution is performed to determine a count of memory cells having a Vt between two voltages in the lower tail (see FIG. 13 as one example).

Step 1604 includes determining a bit line Tco (Tco_VBLC) based on the shift to the Vt distribution. In one embodiment the bit line Tco is determined based on the bitscan count. In an embodiment, a greater bitscan count means more shift to the Vt distribution. A greater shift to the Vt distribution means that the bit line Tco should change more from a default value that corresponds to no shift in the Vt distribution.

Step 1606 includes applying a voltage to the bit lines based on the bit line Tco. Step 1608 includes reading a group of memory cells in the block while applying the voltage to the bit lines.

FIGS. 17A and 17B are graphs depicting cell current versus Vt level. FIGS. 17A and 17B depict portions of threshold voltage distributions of two adjacent data states. FIG. 17A is for an example in which TCO_VBLC is calibrated based on freshly programmed cells and used for both freshly programmed cells and cells that have undergone DR. The solid line curves 1720, 1722 are for the nominal temperature and the dashed curves 1724, 1726 are for high temperature. Curve 1720 is the upper tail of the nominal temperature for the lower state. Curve 1722 is the lower tail for the nominal temperature for the higher state. Curve 1724 is the upper tail for the high temperature for the lower state temperature as read with temperature compensation. Curve 1726 is the lower tail for the high temperature for the higher state temperature as read with temperature compensation. The cross-over point of curves 1720 and 1722 is substantially different from the cross-over point of curves 1724 and 1726.

FIG. 17B is for an example in which TCO_VBLC is initially calibrated based on freshly programmed cells, but is re-calibrated for cells experiencing significant DR impact. The solid line curves 1740, 1742 are for the nominal temperature and the dashed curves 1744, 1746 are for high temperature. Curve 1740 is the upper tail of the nominal temperature for the lower state. Curve 1742 is the lower tail for the nominal temperature for the higher state. Curve 1744 is the upper tail for the high temperature for the lower state temperature as read with temperature compensation. Curve 1746 is the lower tail for the high temperature for the higher state temperature as read with temperature compensation. The cross-over point of curves 1740 and 1742 are at substantially the same point as the cross-over point of curves 1744 and 1746, indicating the substantial improvement that may be achieved by re-calibrating TCO_VBLC for cells experiencing significant DR effect.

FIG. 18 is a flowchart of an embodiment of a process 1800 of reading NAND memory cells while applying a Vread voltage that is based on a Tco based on a shift to a Vt distribution. Process 1800 provides further details of one embodiment of process 1500. In some embodiments, the process 1800 is performed entirely on either the memory die 200 or the integrated memory assembly 211. In some embodiments, the memory controller 120 is also involved with process 1800. Step 1802 includes measuring an amount of shift to a Vt distribution of a group of memory cells since the group was programmed to the Vt distribution. In one embodiment a bit scan of the lower tail of the Vt distribution is performed to determine a count of memory cells having a Vt between two voltages in the lower tail (see FIG. 13 as one example).

Step 1804 includes determining a Vread Tco (Vread-_VBLC) based on the shift to the Vt distribution. In one embodiment the Vread Tco is determined based on the bitscan count. In an embodiment, a greater bitscan count means more shift to the Vt distribution. A greater shift to the Vt distribution means that the Vread Tco should change more from a default value that corresponds to no shift in the Vt distribution.

Step 1806 includes applying a voltage to the unselected word lines based on the VreadTco. Step 1808 includes reading a group of memory cells in the block while applying Vread to the unselected word lines.

FIG. 19 is a flowchart of one embodiment of a process 1900 of reading NAND memory cells after re-calibrating a Tco based on a DR impact. In some embodiments, the process 1900 is performed entirely on either the memory die 200 or the integrated memory assembly 211. In some embodiments, the memory controller 120 is also involved with process 1900. Step 1902 includes re-calibrating a Tco with a TCO DR detect read. Step 1902 may include performing steps 1502 and 1504 of process 1500; steps 1602 and 1606 of process 1600; steps 1802 and 1804 of process 1800, but is not limited thereto. FIG. 20 shows timing of signals in an embodiment of the process of FIG. 19. FIG. 20 provides further details of the TCO DR detect read of step 1902. FIG. 20 is divided timewise into a TCO DR detect read that proceeds the PBP read. FIG. 20 shows a voltage applied to the selected word line (WLsel), as well as the timing of when the sense amplifiers sense the bit lines (Sense). The TCO DR detect read starts with a spike voltage 2002. The spike voltage 2002 is followed by applying two different voltages for the bitscan, in this example. Referring back to FIG. 13, the bitscan is to count memory cells having a Vt between two voltages (Vsa, Vsb) in the lower tail to a candidate distribution (e.g., Vt distribution 1304.) One technique is to apply two different voltages (Vsa, Vsb) to the selected word line. Another technique is to apply the same voltage but to use two different sense times (or integration times) in order to have the effect of testing the memory cells Vt at the two different voltages (Vsa, Vsb). Pulse 2004 shows the sensing for the read that tests the memory cells' Vt relative to Vsb. Each sense amplifier may latch a result from this sensing. Pulse 2006 shows the sensing for the read that tests the memory cells' Vt relative to Vsa. Memory cells having a Vt between Vsa and Vsb will have their data latch flip, which is counted in the distance. Since the bitscan only needs to count the data latches that flipped the counting is relatively fast and simple.

Returning now to the discussion of process 1900, step 1902 will re-calibrate a Tco based on the bitscan count. The Tco may be a bit line Tco, a Vread Tco, but is not limited thereto. Step 1904 includes performing a PBP read with the re-calibrated Tco. This read may be of the same group of memory cells that were tested in the TCO DR detect read or a different group of memory cells (e.g., other cells in the same block). FIG. 20 shows further details of the PBP read. In this example, the PBP read will sense the NAND memory cells at three different levels (Sx, Sy, Sz). For example, these three different levels could be three of the read levels depicted in FIG. 6B. Memory cells that store more or fewer than three bits per cell could also be read in step 1904. Pulse 2008 is the timing of sensing state Sx. Pulse 2010 is the timing of sensing state Sy. Pulse 2012 is the timing of sensing state Sz. In an embodiment the magnitude of the voltage to the bit lines when sensing these states is based on the bit line Tco. In an embodiment the magnitude of the Vread to the unselected word lines when sensing these states is based on the bit line Tco.

Figures 21, 22:
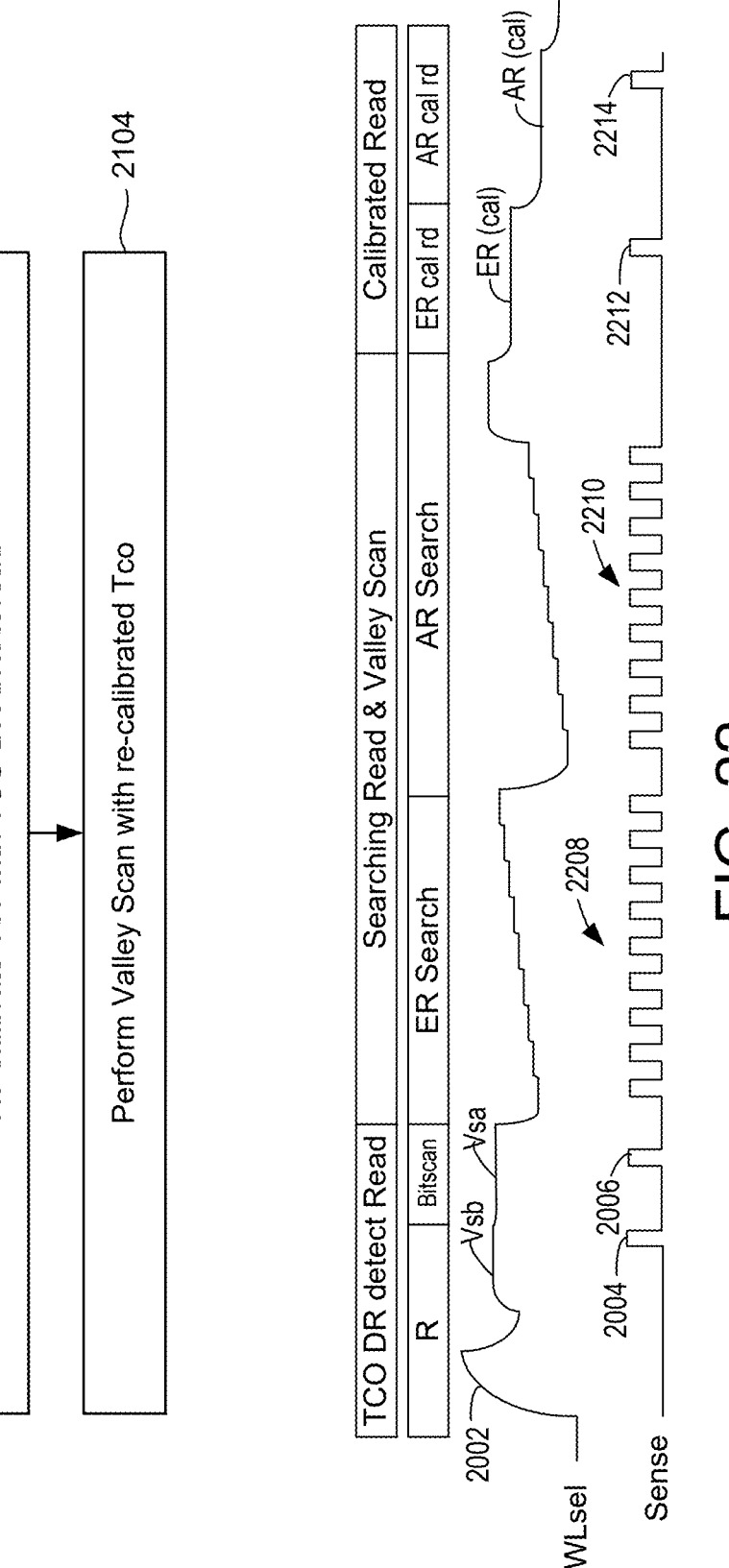
FIG. 21 is a flowchart of one embodiment of a process of performing a valley scan for new read levels for reading NAND memory cells after re-calibrating a Tco based on a DR impact.
FIG. 22 shows timing of signals in an embodiment of the process of FIG. 21.

FIG. 21 is a flowchart of one embodiment of a process 2100 of performing a valley scan for new read levels for reading NAND memory cells after re-calibrating a Tco based on a DR impact. In some embodiments, the process 2100 is performed entirely on either the memory die 200 or the integrated memory assembly 211. In some embodiments, the memory controller 120 is also involved with process 2100. Step 2102 includes re-calibrating a Tco with a TCO DR detect read. Step 2102 may include performing steps 1502 and 1504 of process 1500; steps 1602 and 1606 of process 1600; steps 1802 and 1804 of process 1800, but is not limited thereto. FIG. 22 shows timing of signals in an embodiment of the process of FIG. 21. FIG. 22 provides further details of the TCO DR detect read of step 2102. FIG. 22 is divided timewise into a TCO DR detect read that proceeds a valley scan. The TCO DR detect read may be similar to the one in FIG. 20 and will therefore not be discussed in detail.

Returning now to the discussion of process 2100, step 2102 will re-calibrate a Tco based on the bitscan count. The Tco may be a bit line Tco, a Vread Tco, but is not limited thereto. Step 2104 includes performing a valley scan read with the re-calibrated Tco. This valley scan read may be of the same group of memory cells that were tested in the TCO DR detect read or a different group of memory cells (e.g., other cells in the same block). FIG. 22 shows further details of the valley scan read. In this example, the valley scan read is divided into two scans (ER search and AR search). The ER search may be used to calibrate the VrE level (see FIG. 6B)

and AR search may be used to calibrate the VrA level (see FIG. 6B). Each scan will sense the NAND memory cells at a number of different levels. For the ER search sensing is performed for each level (see sense strobes 2208). For the Ar search sensing is performed for each level (see sense strobes 2210). The valley scan may search for a lowest fail bit count (FBC), as was discussed above in connection with FIGS. 8A-8C. The read level with the lowest FBC may be selected as the updated read level. After the valley scan has been performed to calibrate the VrE level and the VrA level, a calibrated read is performed. The memory cells are sensed (see strobe 2212) for the calibrated VrE level and the memory cells are sensed (see strobe 2214) for the calibrated VrA level.

Figures 23, 24:
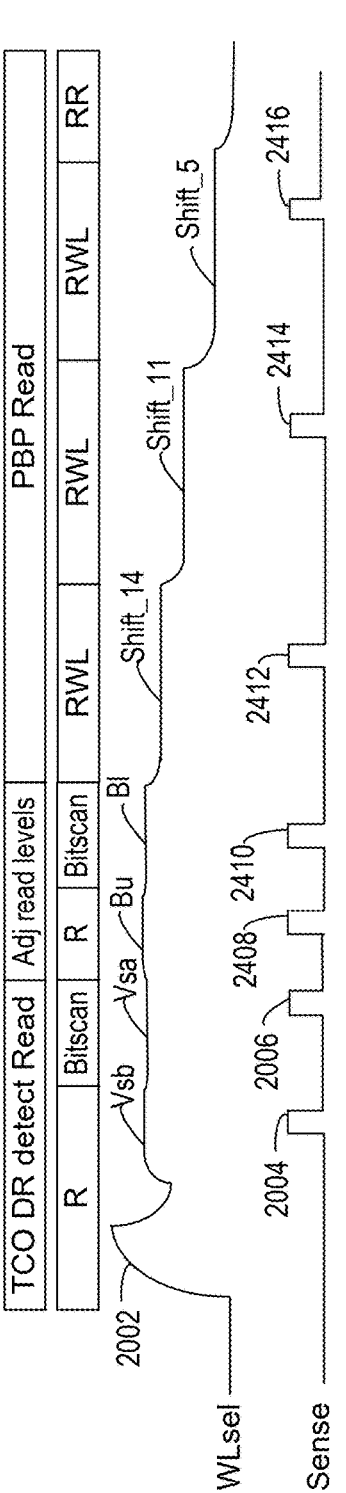
FIG. 23 is a flowchart of one embodiment of a process of reading NAND memory cells with dynamically adjusted read levels after re-calibrating a Tco based on a DR impact.
FIG. 24 shows timing of signals in an embodiment of the process of FIG. 23.

FIG. 23 is a flowchart of one embodiment of a process 2300 of reading NAND memory cells with dynamically adjusted read levels after re-calibrating a Tco based on a DR impact. In some embodiments, the process 2300 is performed entirely on either the memory die 200 or the integrated memory assembly 211. In some embodiments, the memory controller 120 is also involved with process 2300. Step 2302 includes re-calibrating a Tco with a TCO DR detect read. Step 2302 may include performing steps 1502 and 1504 of process 1500; steps 1602 and 1606 of process 1600; steps 1802 and 1804 of process 1800, but is not limited thereto. FIG. 24 shows timing of signals in an embodiment of the process of FIG. 23. FIG. 24 provides further details of the TCO DR detect read of step 2302. FIG. 24 is divided timewise into a TCO DR detect read that proceeds dynamically adjusted read levels, which proceeds reading with the adjusted read levels. The TCO DR detect read may be similar to the one in FIG. 20 and will therefore not be discussed in detail.

Returning now to the discussion of process 2300, step 2302 will re-calibrate a Tco based on the bitscan count. The Tco may be a bit line Tco, a Vread Tco, but is not limited thereto. Step 2304 includes performing a bitscan with the re-calibrated Tco to dynamically adjust read levels. FIG. 24 shows a phase referred to as "adj read levels," which includes a bitscan. This bitscan may be similar to the bitscan in step 2302. Strobes 2408 and 2410 represent the sensing of the memory cells during the bitscan. The bitscan in step 2304 may target the same Vt distribution of step 2302 or a different Vt distribution than step 2302. Step 2304 determines new read levels based on the second bitscan. Step 2306 includes reading memory cells with the dynamically adjusted read levels and re-calibrated Tco. FIG. 24 shows a PBP phase, which is similar to the PBP phase in FIG. 20. However, the read levels in FIG. 24 are the dynamically adjusted levels. In this example, Shift_14, Shift_11, and Shift_5 refer to dynamically adjusted levels for Vr14, Vr11 and Vr5 (see FIG. 6C). However, this read could be performed on cells that store more or fewer than four bits. The strobes 2412, 2414, 2416 represent the sensing of the memory cells during the PBP read with dynamically adjusted read levels.

FIGS. 25A-25G depict further details of an embodiment of Tco parameters 233. FIG. 25A depicts a table that describes a mapping from bitscan counts to adjustments to a default value of TCO_VBLC. In this example, the bit line Tco (TCO_VBLC) has four possible values, as indicated by the TCO_VBLC column 2506. There is a default value and three adjustments (−2 DAC, −4 DAC, −6 DAC). The adjustments indicate the voltage adjustment to the bit line, where the "DAC" represents x mV (x being defined by the memory system). The parameter column 2502 contains a parameter name that correspond to these four values. Each entry in the bitscan count column 2504 contains a range of bitscan counts. The letters "a," "b," and "c" are integers, wherein a<b<c. The values for a, b, and c can be selected by the memory system.

FIGS. 25B-25D are tables that show how the memory system may select the count number for the bitscan count field 2504 in the table in FIG. 25A. The table in FIG. 25B may be used to select the value for "a" in the bitscan count field 2504. The table in FIG. 25C may be used to select the value for "b" in the bitscan count field 2504. The table in FIG. 25D may be used to select the value for "c" in the bitscan count field 2504. In this example, a=80, b=140, and c=200, as indicated by the "x" in the tables in FIGS. 25B-25D. The Address field in FIGS. 25B-25D shows the two bit values for an address in the Tco parameters 233. The memory system sets these two bits in order to establish the value for a, b, and c.

FIGS. 25E-25G are tables that show how the memory system may select the DAC values for field 2506 in the table in FIG. 25A. The table in FIG. 25E may be used to select the DAC value for TCO_DR1. The table in FIG. 25F may be used to select the DAC value for TCO_DR2. The table in FIG. 25G may be used to select the DAC value for TCO_DR2. In this example, the selected values are consistent with the DAC values in the table in FIG. 25A. However, FIGS. 25E-25G show alternative DAC values if a different bit setting is used at the appropriate address in the Tco parameters 233. In this example, only a single bit is used per DAC, but additional bits could be used to allow for more values in the DAC.

In view of the foregoing, an embodiment includes an apparatus comprising one or more control circuits configured to connect to a NAND memory structure. The NAND memory structure has blocks having NAND strings and word lines associated with the NAND strings. The NAND memory structure has bit lines associated with the NAND strings. The one or more control circuits configured to measure a data retention impact to a data state of a group of NAND memory cells in a selected block of NAND memory cells since the group was programmed to the data state. The one or more control circuits configured to set a temperature coefficient (Tco) based on the data retention impact. The one or more control circuits configured to read NAND memory cells in the selected block based on the set Tco.

In a further embodiment, the temperature coefficient (Tco) includes a bit line Tco for a bit line voltage during read. The one or more control circuits are configured to apply a voltage to the bit lines during the read of the NAND memory cells in the selected block based on the set Tco, wherein a magnitude of the bit line voltage depends on the bit line Tco.

In a further embodiment, the temperature coefficient (Tco) includes a read pass Tco for a read pass voltage during read. The one or more control circuits are configured to apply a voltage to unselected word lines in the selected block during the read of the NAND memory cells in the selected block based on the set Tco, wherein a magnitude of the unselected word line voltage depends on the read pass Tco.

In a further embodiment, the one or more control circuits are configured to program the group of memory cells in the selected block to a plurality of threshold voltage distributions prior to measuring the data retention impact in the group. The one or more control circuits are configured to measure a shift in a candidate threshold voltage distribution of the plurality of threshold voltage distributions to determine the data retention impact. And the one or more control circuits are configured to set the Tco based the shift in the threshold voltage distribution.

In a further embodiment, the shift in the candidate threshold voltage distribution is a downshift in the candidate threshold voltage distribution.

In a further embodiment, the one or more control circuits are configured to program the group of memory cells in the selected block to a plurality of threshold voltage distributions prior to measuring the data retention impact in the group. The one or more control circuits are configured to read the group of memory cells at two voltage levels associated with a candidate threshold voltage distribution of the plurality of threshold voltage distributions. The one or more control circuits are configured to determine how many memory cells in the group have a threshold voltage between the two voltage levels to determine the data retention impact in the group. The one or more control circuits are configured to set the Tco based on how many memory cells in the group have a threshold voltage between the two voltage levels.

In a further embodiment, the two voltage levels associated with the candidate threshold voltage distribution are within a lower tail of the candidate threshold voltage distribution.

In a further embodiment, the one or more control circuits are configured to read the NAND memory cells in the selected block based on the set Tco during a normal read that uses present values for read levels.

In a further embodiment, the one or more control circuits are configured to perform a valley scan search during the read of the NAND memory cells in the selected block based on the set Tco. The valley scan search comprises reading at a plurality of read levels associated with a data state. The one or more control circuits are configured to determine a new read level for the data state based on a read level in the valley scan search having a lowest fail bit count (FBC).

In a further embodiment, the one or more control circuits are configured to dynamically update read levels based on the read of the NAND memory cells in the selected block based on the set Tco. And the one or more control circuits are configured to read NAND memory cells in the selected block based on the dynamically updated read levels and the set Tco.

In a further embodiment, the one or more control circuits are configured to perform a valley scan search during the read of the NAND memory cells in the selected block based on the set Tco. The valley scan search comprises reading at a plurality of read levels associated with a data state. And the one or more control circuits are configured to determine a new read level for the data state based on a read level in the valley scan search having a lowest fail bit count (FBC).

In a further embodiment, the one or more control circuits are configured to dynamically update read levels based on the read of the NAND memory cells in the selected block based on the set Tco and read NAND memory cells in the selected block based on the dynamically updated read levels and the set Tco.

In a further embodiment, the one or more control circuits configured to perform a bitscan of the group of NAND memory cells in the selected block to determine a bitscan count that indicates the data retention impact. The one or more control circuits configured to access a table from non-transitory memory, wherein the table comprises entries that associate bitscan count ranges to modifications to the Tco. And The one or more control circuits configured to set the Tco based on the bitscan count determined from the bitscan.

An embodiment includes a method for operating non-volatile storage. The method comprises determining a bit line voltage temperature coefficient (Tco) based on a shift to a threshold voltage distribution to which a group of NAND memory cells in the non-volatile storage were programmed. The NAND memory cells are associated with a set of bit lines in the non-volatile storage. The method comprises applying a bit line voltage to the set of bit lines that has a magnitude based on the bit line Tco. The method comprises reading selected NAND memory cells associated with the set of bit lines while applying the bit line voltage to the set of bit lines.

An embodiment includes a non-volatile memory system, comprising a NAND memory structure having NAND memory cells, bit lines associated with the NAND memory cells and word lines associated with the NAND memory cells. The non-volatile memory system comprises one or more control circuits in communication with the NAND memory structure. The one or more control circuits are configured to determine a number of first NAND memory cells in a selected block having a threshold voltage within a voltage range in a lower tail of a candidate threshold voltage distribution. The one or more control circuits are configured to determine a bit line voltage temperature coefficient (Tco) based on the number of first NAND memory cells having a threshold voltage within the voltage range. The one or more control circuits are configured to apply a voltage to the bit lines that is based on the bit line voltage Tco. The one or more control circuits are configured to read second NAND memory cells in the selected block while applying the voltage that is based on the bit line voltage Tco to the bit lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits configured to connect to a NAND memory structure, the NAND memory structure having blocks having NAND strings and word lines associated with the NAND strings, the NAND memory structure having bit lines associated with the NAND strings, the one or more control circuits configured to:

measure a data retention impact to a data state of a group of NAND memory cells in a selected block of NAND memory cells since the group was programmed to the data state, including determining an amount of a downshift of a lower tail of a candidate threshold voltage distribution of a plurality of threshold voltage distributions to which the group of NAND memory cells were programmed;

set a temperature coefficient (Tco) based on the amount of the downshift of the lower tail of the candidate threshold voltage distribution; and read NAND memory cells in the selected block based on the set Tco and a present temperature.

2. The apparatus of claim 1, wherein:

the temperature coefficient (Tco) includes a bit line Tco for a bit line voltage during read; and the one or more control circuits are configured to apply a voltage to the bit lines during the read of the NAND memory cells in the selected block based on the set Tco and the present temperature, wherein a magnitude of the bit line voltage depends on the bit line Tco and the present temperature.

3. The apparatus of claim 1, wherein:

the temperature coefficient (Tco) includes a read pass Tco for a read pass voltage during read; and the one or more control circuits are configured to apply a voltage to unselected word lines in the selected block during the read of the NAND memory cells in the selected block based on the set Tco and the present temperature, wherein a magnitude of the unselected word line voltage depends on the read pass Tco and the present temperature.

4. The apparatus of claim 1, wherein the one or more control circuits are configured to:

read the group of memory cells at two voltage levels associated with the lower tail of the candidate threshold voltage distribution of the plurality of threshold voltage distributions;

determine how many memory cells in the group have a threshold voltage between the two voltage levels to determine the amount of the downshift of the lower tail to determine the data retention impact in the group; and set the Tco based on how many memory cells in the group have a threshold voltage between the two voltage levels in order to set the Tco based on the amount of the downshift of the lower tail.

5. The apparatus of claim 1, wherein the one or more control circuits are configured to:

perform a valley scan search during the read of the NAND memory cells in the selected block based on the set Tco and the present temperature, the valley scan search comprising reading at a plurality of read levels associated with a data state; and determine a new read level for the data state based on a read level in the valley scan search having a lowest fail bit count (FBC).

6. The apparatus of claim 1, wherein the one or more control circuits are configured to:

dynamically update read levels based on the read of the NAND memory cells in the selected block based on the set Tco and the present temperature; and read NAND memory cells in the selected block based on the dynamically updated read levels, the set Tco, and the present temperature.

7. The apparatus of claim 1, wherein the one or more control circuits are configured to:

perform a bitscan of the group of NAND memory cells in the selected block to determine a bitscan count that determines the downshift of the lower tail of the candidate threshold voltage distribution to indicate the data retention impact;

access a table from non-transitory memory, wherein the table comprises entries that associate bitscan count ranges to modifications to the Tco; and set the Tco based on the bitscan count determined from the bitscan.

8. A method for operating non-volatile storage, the method comprising:

determining a bit line voltage temperature coefficient (Tco) based on a shift to a candidate threshold voltage distribution to which a group of NAND memory cells in the non-volatile storage were programmed, the NAND memory cells associated with a set of bit lines in the non-volatile storage, including establishing the bit line voltage Tco based on how many memory cells in the group have a threshold voltage between two voltage levels associated with a lower tail of the candidate threshold voltage distribution;

applying a bit line voltage to the set of bit lines that has a magnitude based on the bit line voltage Tco and a present temperature; and reading selected NAND memory cells associated with the set of bit lines while applying the bit line voltage to the set of bit lines.

9. The method of claim 8, wherein:

the group of NAND memory cells reside in a selected block; and reading the selected NAND memory cells associated with the set of bit lines while applying the bit line voltage to the set of bit lines includes reading NAND memory cells in the selected block other than the group of NAND memory cells.

10. The method of claim 8, further comprising accessing a default bit line voltage Tco for freshly programmed memory cells that are programmed to a plurality of threshold voltage distribution including the candidate threshold voltage distribution, wherein the default bit line voltage Tco assumes no shift to the candidate threshold voltage distribution;

wherein determining the bit line voltage Tco based on the shift to the candidate threshold voltage distribution to which the group of NAND memory cells in the non-volatile storage were programmed includes re-calibrating the default bit line voltage Tco to account for effects of data retention on the group of NAND memory cells.

11. A non-volatile memory system, comprising:

a NAND memory structure having NAND memory cells, bit lines associated with the NAND memory cells and word lines associated with the NAND memory cells; and one or more control circuits in communication with the NAND memory structure, the one or more control circuits configured to:

program NAND memory cells in a selected block to a plurality of threshold voltage distributions;

determine a number of first NAND memory cells in the selected block having a threshold voltage within a voltage range in a lower tail of a candidate threshold voltage distribution of the plurality of threshold voltage distributions;

determine a bit line voltage temperature coefficient (Tco) based on the number of first NAND memory cells having a threshold voltage within the voltage range;

read the first NAND memory cells in the selected block while applying a first voltage to the bit lines that is based on the bit line voltage Tco and a first present temperature; and read second NAND memory cells in the selected block while applying a second voltage that is based on the bit line voltage Tco and a second present temperature.

12. The non-volatile memory system of claim 11, wherein the one or more control circuits are configured to:

access a table from non-transitory memory, wherein the table comprises entries that associate bitscan count ranges to modifications to a default bit line voltage Tco, the bitscan count being a number of memory cells having a threshold voltage within the voltage range in the lower tail of the candidate threshold voltage distribution;

select an entry in the table that corresponds to the number of the first NAND memory cells in the selected block having a threshold voltage within the voltage range in the lower tail of the candidate threshold voltage distribution; and determine the bit line voltage Tco based on the modification to the bit line voltage Tco in the selected entry.

13. The non-volatile memory system of claim 11, wherein the one or more control circuits are configured to:

determine a Vread temperature coefficient (Tco) based on the number of the first NAND memory cells having a threshold voltage within the voltage range;

apply a voltage to unselected word lines in the selected block that is based on the Vread Tco and a third present temperature; and read third NAND memory cells in the selected block while applying the voltage that is based on the Vread Tco and the third present temperature to the unselected word lines.

14. The non-volatile memory system of claim 11, wherein the one or more control circuits are configured to:

dynamically update read levels based on the read of the second NAND memory cells in the selected block while applying the second voltage that is based on the bit line voltage Tco and the second present temperature to the bit lines; and read third NAND memory cells in the selected block based on the dynamically updated read levels, the bit line voltage Tco, and a third present temperature.

* * * * *